(12) United States Patent
Xiao et al.

(10) Patent No.: US 11,974,502 B2
(45) Date of Patent: Apr. 30, 2024

(54) SOFT MOTHERBOARD-RIGID PLUGIN MODULE ARCHITECTURE

(71) Applicant: The Regents of the University of Colorado, Denver, CO (US)

(72) Inventors: Jianliang Xiao, Louisville, CO (US); Yan Sun, Boulder, CO (US); Wei Ren, Boulder, CO (US)

(73) Assignee: The Regents of the University of Colorado, Denver, CO (US)

( * ) Notice: Subject to any disclaimer, the term of this patent is extended or adjusted under 35 U.S.C. 154(b) by 273 days.

(21) Appl. No.: 17/668,799

(22) Filed: Feb. 10, 2022

(65) Prior Publication Data
US 2022/0256711 A1    Aug. 11, 2022

Related U.S. Application Data

(60) Provisional application No. 63/147,958, filed on Feb. 10, 2021.

(51) Int. Cl.
*H10N 10/01* (2023.01)
*H01L 25/04* (2023.01)
(Continued)

(52) U.S. Cl.
CPC ............ *H10N 10/01* (2023.02); *H01L 25/04* (2013.01); *H01L 25/0655* (2013.01); *H05K 1/0283* (2013.01); *H10N 10/17* (2023.02)

(58) Field of Classification Search
CPC ........ H10N 10/01; H10N 10/17; H01L 25/04; H01L 25/0655; H01L 35/08; H01L 35/34; H05K 1/0283
See application file for complete search history.

(56) References Cited

U.S. PATENT DOCUMENTS

| | | | | | |
|---|---|---|---|---|---|
| 4,586,827 | A | * | 5/1986 | Hirsch ................. | H01R 12/675 368/282 |
| 2014/0220422 | A1 | * | 8/2014 | Rogers .................... | H01L 23/18 438/117 |

(Continued)

OTHER PUBLICATIONS

Bariya, et al., "Wearable sweat sensors", Nat. Electron. 1, 2018, 160-171.

(Continued)

*Primary Examiner* — Timothy J Thompson
*Assistant Examiner* — Michael F McAllister
(74) *Attorney, Agent, or Firm* — Saul Ewing LLP; Kathryn Doyle; Domingos J. Silva

(57) ABSTRACT

Soft motherboards having rigid plugin modules are described herein. In one aspect of the present disclosure, an electronic device can include a polymeric substrate having: a plurality of slots, each configured for receiving an electronic module; one or more electrical junctions including a stretchable conductive interconnect electronically coupling a slot to another slot of the plurality of slots; and at least one electronic module including: a film configured to: support other components of the electronic module; and be inserted, and be partially housed in, one of the plurality of slots of the polymeric substrate; and at least one electrode coupled to the film and positioned to be in contact with a corresponding electrical junction of the polymeric substrate when the film is partially housed in the polymeric substrate.

10 Claims, 26 Drawing Sheets

(51) Int. Cl.
  *H01L 25/065* (2023.01)
  *H05K 1/02* (2006.01)
  *H10N 10/17* (2023.01)

(56) References Cited

U.S. PATENT DOCUMENTS

| | | | | |
|---|---|---|---|---|
| 2016/0073503 | A1* | 3/2016 | Singleton | H05K 3/326 361/767 |
| 2016/0163949 | A1* | 6/2016 | Stark | H10N 10/817 438/54 |
| 2018/0351069 | A1* | 12/2018 | Boukai | H10N 10/13 |

OTHER PUBLICATIONS

Chung, et al., "Binodal, wireless epidermal electronic systems with in-sensor analytics for neonatal intensive care", Science 363, eaau0780, 2019.

Goncalves, et al., "Optimization of thermoelectric thin-films deposited by co-evaporation on plastic substrates".

Hong, et al., "Wearable and Implantable Devices for Cardiovascular Healthcare: from Monitoring to Therapy Based on Flexible and Stretchable Electronics", Adv. Funct. Mater. 29, 1808247, 2019.

Jin, et al., "Flexible layer-structured Bi2Te3 thermoelectric on a carbon nanotube scaffold", Nat. Mater. 18, 2019, 62-68.

Jin, et al., "Malleable and Recyclable Thermosets: The Next Generation of Plastics", Matter. 1, 2019, 1456-1493.

Jinno, et al., "Stretchable and waterproof elastomer-coated organic photovoltaics for washable electronic textile applications", Nat. Energy. 2, 2017, 780-785.

Jo, et al., "Ink Processing for Thermoelectric Materials and Power-Generating Devices", Adv. Mater. 31, 1804930, 2019.

Kang, et al., "Self-healing soft electronics", Nat. Electron. 2, 2019, 144-150.

Kang, et al., "Tough and Water-Insensitive Self-Healing Elastomer for Robust Electronic Skin", Adv. Mater. 30, 1706846, 2018.

Kim, et al., "Dissolvable films of silk fibroin for ultrathin conformal bio-integrated electronics", Nat. Mater. 9, 2010, 511-517.

Nan, et al., "Compliant and stretchable thermoelectric coils for energy harvesting in miniature flexible devices", Sci. Adv.; 4: eaau5849, Nov. 2, 2018.

Oh, et al., "Stretchable self-healable semiconducting polymer film for active-matrix strain-sensing array", Sci. Adv. 5, eaav3097, 2019.

Rogers, et al., "Materials and mechanics for stretchable electronics", Science 327, 2010, 1603-1607.

Son, et al., "An integrated self-healable electronic skin system fabricated via dynamic reconstruction of a nanostructured conducting network", Nat. Nanotechnol. 13, 2018, 1057-1065.

Sun, et al., "Stretchable fabric generate electric power from woven thermoelectric fibers", Nature Communications, https://doi.org/10.1038/s41467-020-14399-6.

Taynton, et al., "Heat- or Water-Driven Malleability in a Highly Recyclable Covaltn Network Polymer", Advanced Materials, vol. 26, No. 23, Jun. 8, 2014, pp. 3938-3942.

Tee, et al., "An electrically and mechanically self-healing composite with pressure- and flexion-sensitive properties for electronic skin applications.", Nat Nanotechnol 7, 2012, 825-832.

Venkatasubramanian, et al., "Thin-film thermoelectric devices with high room-temperature figures of merit", Nature. 413, 2001, 597-602.

Wang, et al., "User-interactive electronic skin for instantaneous pressure visualization.", Nature materials 12, 2013, 899-904.

Zou, et al., "Rehealable, fully recyclable, and malleable electronic skin enabled by dynamic covalent thermoset nanocomposite", Science Advances, vol. 4, No. 2, Feb. 9, 2018, pp. 1-7.

* cited by examiner

Procedures    Schematic diagrams

1) Cut off the terminal of the TEG to expose the liquid metal junction.

2) Contact physically the exposed terminals of the two TEGs.

3) Add a small amount of polyimine solution to the joint of the two TEGs.

| Type | Composition (at %) | Thickness (μm) | Resistivity (Ω·m) | Seebeck coefficient (μV/K) | Power Factor (μW/mK²) | Thermal Conductivity (W/mK) | ZT |
|---|---|---|---|---|---|---|---|
| n-type | 18.7Bi-75Te-6.3Se | 1.6 | 3.66e-5 | -145 | 584 | 1.315 | 0.13 |
| p-type | 36.7Sb-2.2Bi-61.1Te | 1.75 | 1.06e-5 | 169 | 2694 | 1.285 | 0.63 |

FIG. 25

| Type | Size, L×W×H (mm³) | Number of Legs | ΔT (K) | P_max (μW/cm²) | V_oc (mV/cm²) | P/ΔT² (10⁻⁹μW/K²) | V/ΔT (μV/K) | Flexibility (mm) | Stretchability |
|---|---|---|---|---|---|---|---|---|---|
| Film | 12×12×7 | 112 | 93 | 18.625 | 980.043 | 5.15 | 271 | 3.5 | 120% |
|  | 15×15×1 | 128 | 19 | 8.9E-4 | 22.8 | 0.0016 | 42.2 | 2⁺ | 60% |
|  | 45×30×2.1 | 760 | 8 | 7.4E-3 | 3.6 | 0.033 | 16 | 6⁺ | — |
| Bulk | 50×50×6 | 142 | 8 | 37.5 | 6.65 | 1651 | 357.5 | 30 | — |
|  | 50×50×1.16 | 500 | 105 | 84000 | 200 | 80000 | 198.5 | 150 | — |
|  | 15×20×0.5 | 16 | 50 | 3800 | 30 | 28500 | 225 | 20⁺ | — |
| Printed | 25×6×0.6 | 24 | 20 | 0.149 | 16.7 | 0.93 | 104.4 | 8⁺ | — |
|  | 50×50×4 | 16 | 25 | 0.187 | 1.44 | 23.38 | 180 | 20⁺ | — |
|  | 40×40×0.8 | 144 | 25 | 4780 | 31.25 | 4.9489 | 277.8 | 30 | — |
|  | 120×120×0.17 | 1085 | 70 | 5.5 | 25.4 | 11.4 | 52.7 | 2⁺ | — |
| Fiber | 80×4×10 | 120 | 40 | 17.425 | 30 | 23.23 | 40 | 20⁺ | — |
|  | 15×20×7.84 | 30 | 44.4 | 1.547 | 14.33 | 6.97 | 64.6 | 2⁺ | 80% |
| Organics | 140×140×0.55 | 162 | 85.5 | 1.65E-3 | 2.65 | 0.046 | 75 | 25⁺ | — |
|  | 50×25×— | 16 | 20 | 2.4E-4 | 0.64 | 0.019 | 50 | 10⁺ | — |

FIG. 26

SOFT MOTHERBOARD-RIGID PLUGIN MODULE ARCHITECTURE

CROSS-REFERENCE TO RELATED APPLICATIONS

This application claims priority under 35 U.S.C. § 119(e) to U.S. Provisional Application No. 63/147,958 filed Feb. 10, 2021, which application is incorporated herein by reference in its entirety.

STATEMENT REGARDING FEDERALLY SPONSORED RESEARCH OR DEVELOPMENT

This invention was made with government support under grant number CMMI1762324 awarded by the National Science Foundation. The government has certain rights in the invention.

BACKGROUND OF THE INVENTION

Polyimine compositions can include useful characteristics such as stretchability, healability, and recyclability.

SUMMARY

Soft motherboards having rigid plugin modules are described herein. In one aspect of the present disclosure, an electronic device can include a polymeric substrate having: a plurality of slots, each configured for receiving an electronic module; one or more electrical junctions including a stretchable conductive interconnect electronically coupling a slot to another slot of the plurality of slots; and at least one electronic module including: a film configured to: support other components of the electronic module; and be inserted, and be partially housed in, one of the plurality of slots of the polymeric substrate; and at least one electrode coupled to the film and positioned to be in contact with a corresponding electrical junction of the polymeric substrate when the film is partially housed in the polymeric substrate.

This aspect can include a variety of embodiments. In certain embodiments, at least one electronic module can include a thermoelectric generator (TEG).

In other embodiments, at least one electronic module is further configured to be inserted in, and partially housed in, each of the plurality of slots of the polymeric substrate.

In certain embodiments, at least one electronic module can include a battery, a processor, memory, a communication module, a sensing module, or a combination thereof.

In certain embodiments, at least one electronic module further includes at least one p-leg and at least one n-leg coupled to the film, where the at least one p-leg and the at least one n-leg are electronically coupled together via an electrode.

In certain embodiments, an electronic device system can include the electronic device, and another electronic device, wherein the electronic device and the other electronic device are coupled to one another via a defined polymeric substrate edge of each electronic device.

In certain embodiments, a method of forming a plurality of electronic devices can include splitting the polyimine substrate of the electronic device between two of the slots of the polymeric substrate and along the length of the two slots.

In certain embodiments, a method of recycling the electronic device can include immersing the electronic device into a volume of recycling solution comprising 3,3'-Diamino-N-methyldipropylamine and tris(2-aminoethyl) amine in methanol. In some cases, the method can further include separating the stretchable conductive interconnects and the electrodes from the resulting recycled solution. In some cases, the method can further include adding a volume of terephthalaldehyde and methanol to the resulting recycled solution.

BRIEF DESCRIPTION OF THE DRAWINGS

For a fuller understanding of the nature and desired objects of the present invention, reference is made to the following detailed description taken in conjunction with the accompanying drawing figures wherein like reference characters denote corresponding parts throughout the several views.

FIG. 25 depicts a table of physical properties of thermoelectric films at room temperature.

FIG. 26 depicts a summary of experimental results of flexible TEGs reported in the literature, grouped by fabrication methods of thermoelectric materials.

DEFINITIONS

Figure 1:
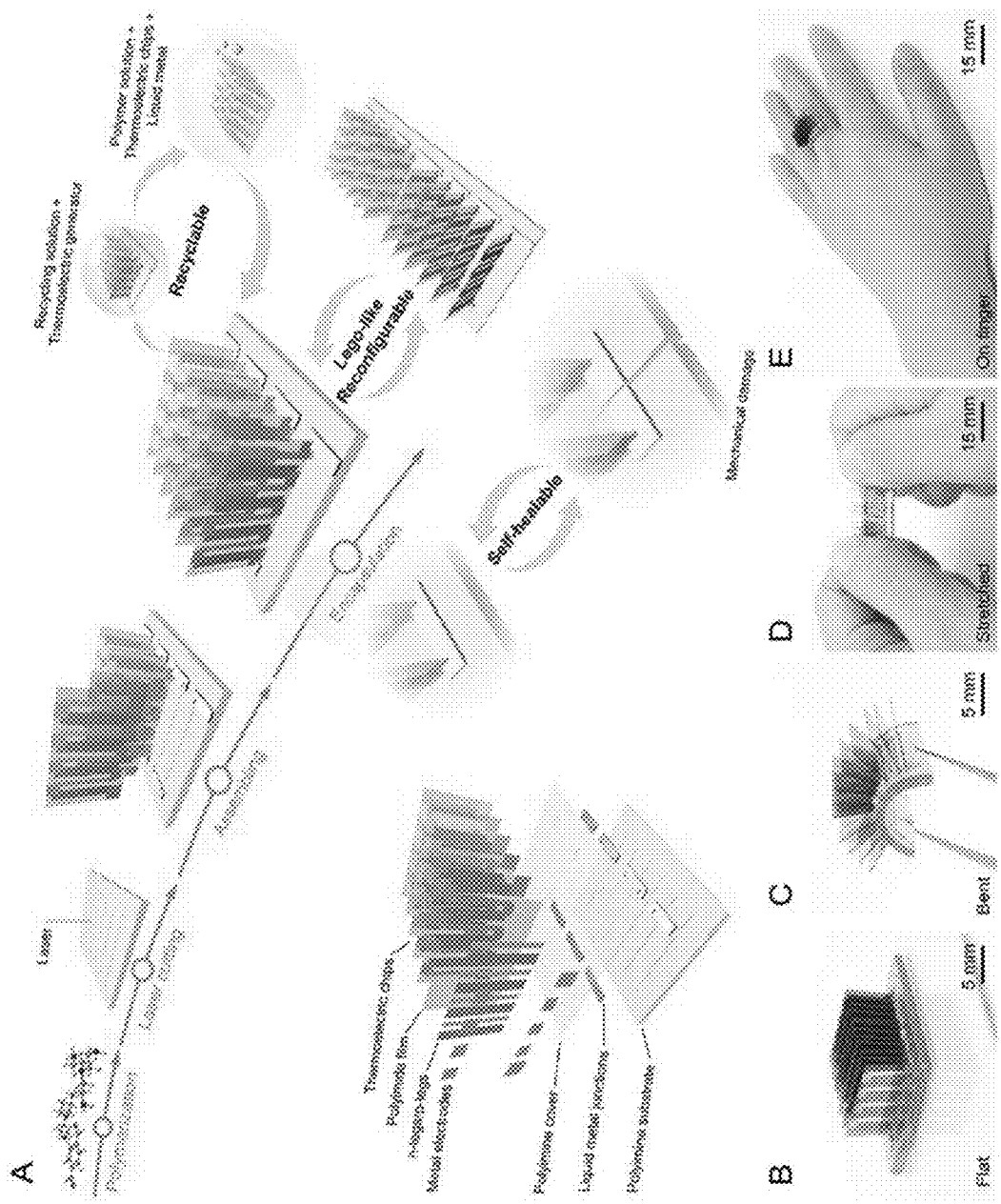
FIG. 1 depicts design and fabrication of a thermoelectric generator (TEG). Panel (A) depicts a schematic illustration of the design, fabrication process, and key characteristics, including self-healability, recyclability and Lego-like reconfigurability. Optical images of the TEG when it is flat (Panel (B)), bent (Panel (C)), stretched (Panel (D)) and worn on the finger (Panel (E)).

The instant invention is most clearly understood with reference to the following definitions.

As used herein, the singular form "a," "an," and "the" include plural references unless the context clearly dictates otherwise.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from context, all numerical values provided herein are modified by the term about.

As used in the specification and claims, the terms "comprises," "comprising," "containing," "having," and the like can have the meaning ascribed to them in U.S. patent law and can mean "includes," "including," and the like.

Unless specifically stated or obvious from context, the term "or," as used herein, is understood to be inclusive.

Ranges provided herein are understood to be shorthand for all of the values within the range. For example, a range of 1 to 50 is understood to include any number, combination of numbers, or sub-range from the group consisting 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 (as well as fractions thereof unless the context clearly dictates otherwise).

DETAILED DESCRIPTION OF THE INVENTION

Systems and associated methods for a reconfigurable polyimine electronic device is described herein. A polymeric substrate (e.g., polyimine, hydrogels, EcoFlex, polydimethylsiloxane (PDMS), and the like) can include a plurality of slots for receiving electronic modules. The polymeric substrate can also include a set of stretchable conductive interconnects (e.g., liquid metal junctions, serpentine metal interconnects, conductive rubber, conductive composites, and the like) electronically connecting the slots to one another. When the slots receive an electronic module, the module can be electronically connected to other modules in other slots of the substrates via the stretchable conductive interconnects.

The electronic modules can include a variety electronic chips that can support or perform a variety of functions. The below examples discuss the use of thermoelectric generator (TEG) modules, where each module can include a p-leg and a n-leg for converting temperature difference across the module into an electric current. However, other types of modules can be implemented as well. For example, an electronic module can include memory, processing units, batteries, specific functional units (e.g., that perform a specific function), and the like.

Each electronic module can be configured to enter, and be partially housed in, a slot of the polymeric substrate. Once partially housed, electrical contacts of the electronic module can electronically couple the module to the stretchable conductive interconnects of the polymeric substrate, thereby electronically connecting the electronic module to other electronic modules in other slots of the polymeric substrate.

Thus, the polymeric substrate can act as a soft motherboard, where electronic modules can be mixed and matched in the substrate slots. The properties of the polymeric substrate and stretchable conductive interconnects can also allow for the electronic device to be stretchable, twistable, healable, and recyclable. A substrate edge can also be coupled to an edge of another polymeric substrate, thereby fusing multiple polymeric electronic devices together to form a new device. Likewise, a polymeric substrate can be cut to separate the substrate into multiple polymeric electronic devices. This ability will be referred to in the below description as a Lego-like capability, where polymeric electronic devices can be coupled together and taken apart like building blocks.

Example 1: Thermoelectric Generator Modules

Thermoelectric generators (TEGs) can directly convert low-grade heat to electricity, and thus are very promising energy sources for wearable electronics and 'Internet of Things'. However, conventional TEGs are rigid and brittle, and thus are not adaptable to the complex geometrical and compliant material properties of the human body. Recently, developing flexible TEG systems has attracted a lot of attention, including using thermoelectric (TE) films, TE bulks, printable TE inks, TE fibers and organic TE materials. However, very few studies reported TEGs with good stretchability which is critical to ensure conformal contact with complex geometries of human body for optimal thermoelectric performance. Inspired by the self-healing capability of human skin, self-healable electronics has also shown promising potential in wearable electronics for improved reliability and durability. However, this capability has not been achieved in TEG systems yet.

This work reports the first self-healable and recyclable TEG system with superior stretchability and thermoelectric performance. A record-high open-circuit voltage among flexible TEGs is achieved, reaching 1 V/cm$^2$ at temperature difference 95 K. Furthermore, this TEG system has the Lego-like reconfigurability, allowing users to customize the energy harvesting device according to thermal and mechanical conditions. These properties are realized by integrating high-performance modular thermoelectric chips, dynamic covalent thermoset polyimine as substrate and encapsulation, and flowable liquid metal as electrical wiring through a novel mechanical architecture design of "soft motherboard-rigid plugin modules". Finally, a wavelength-selective metamaterial film is introduced to the cold side of the TEG to enhance the thermoelectric performance under solar irradiation, which is critically important for wearable energy harvesting during outdoor activities.

Device Design and Fabrication

Figure 6:
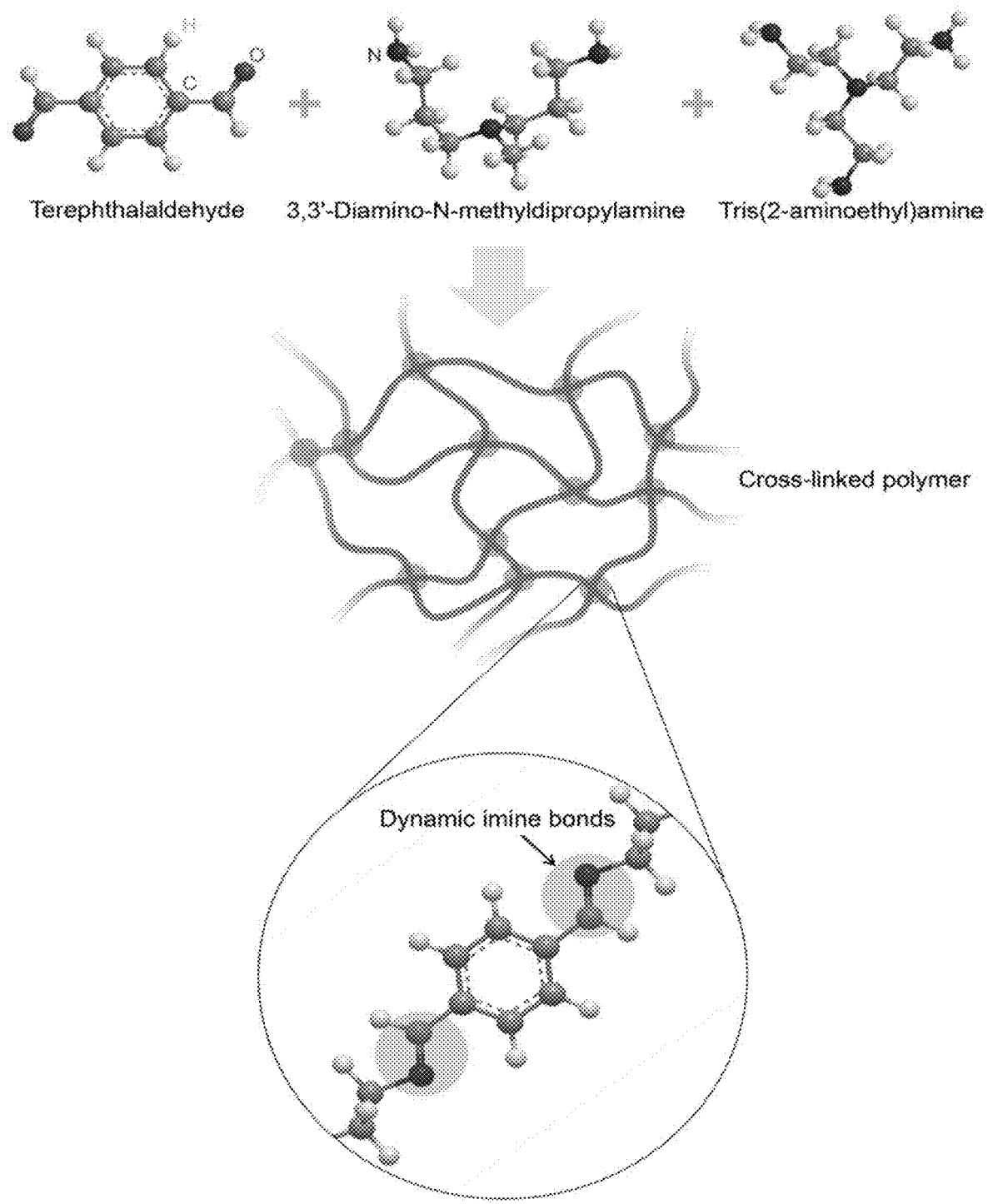
FIG. 6 depicts polymerization of polyimine using three commercially available monomers.
Figure 7:
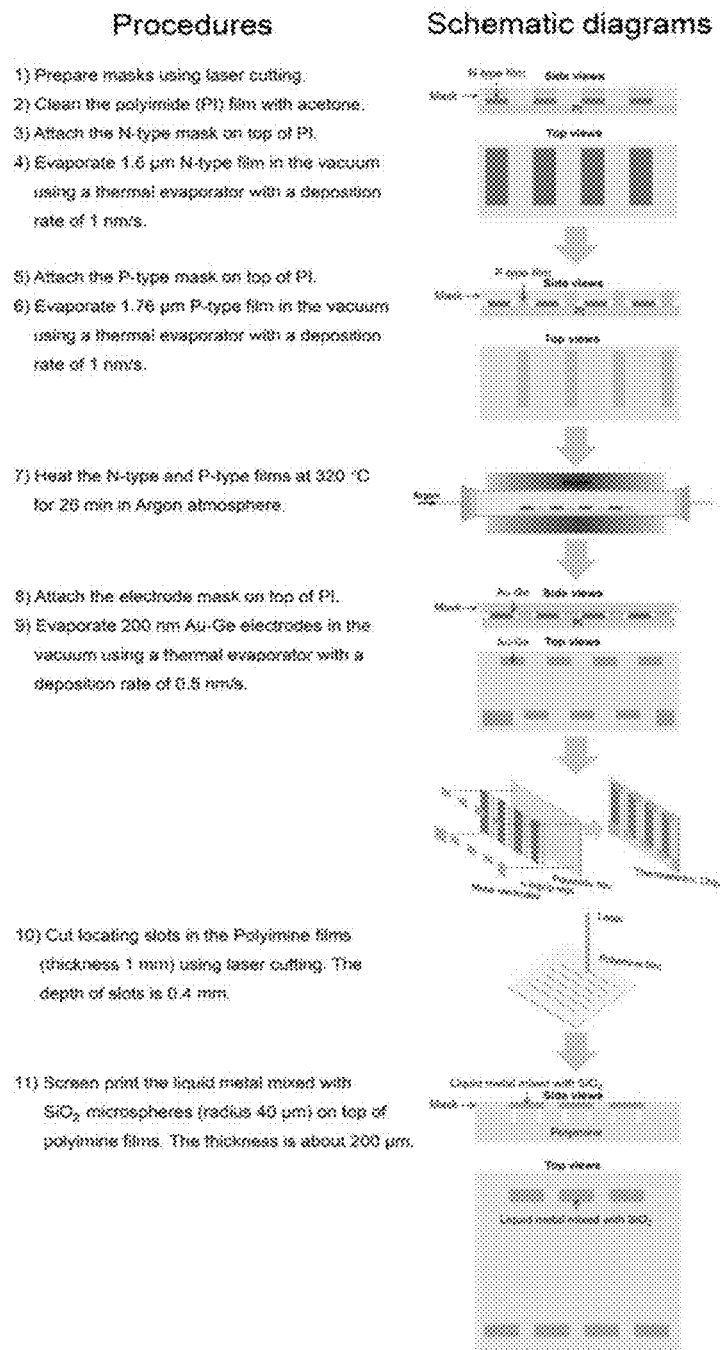
FIG. 7 depicts a schematic illustration of step-by-step fabrication processes of thermoelectric chips and polyimine substrates.
Figure 8:
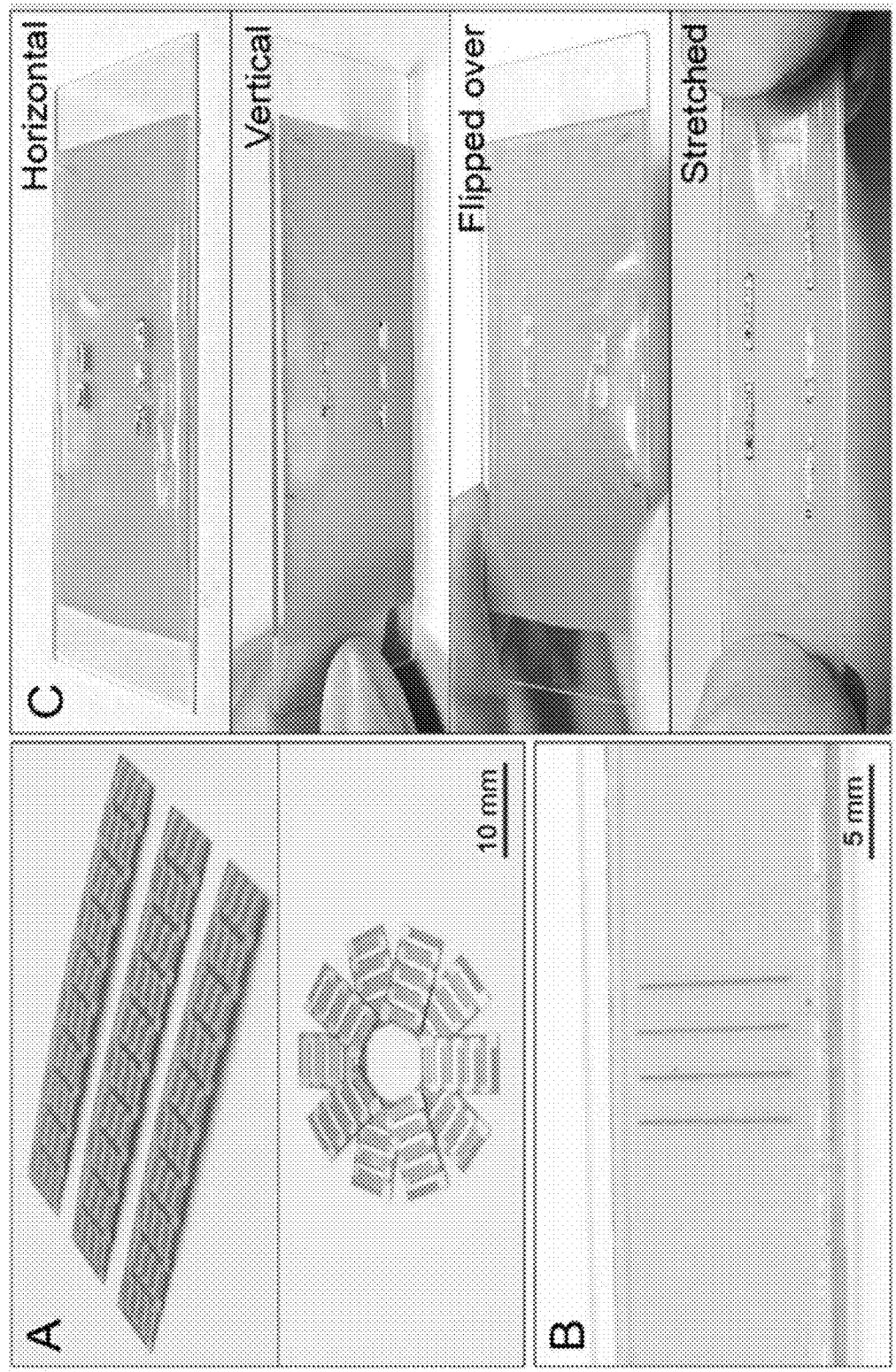
FIG. 8: Panel (A) depicts an optical image of thermoelectric chips. Panel (B) depicts an optical image of a polyimine substrate with laser cutting slots. Panel (C) depicts an optical image of the printed liquid metal wirings on a polyimine substrate at room temperature, when the substrate is horizontal, vertical, flipped over, and stretched.
Figure 9:
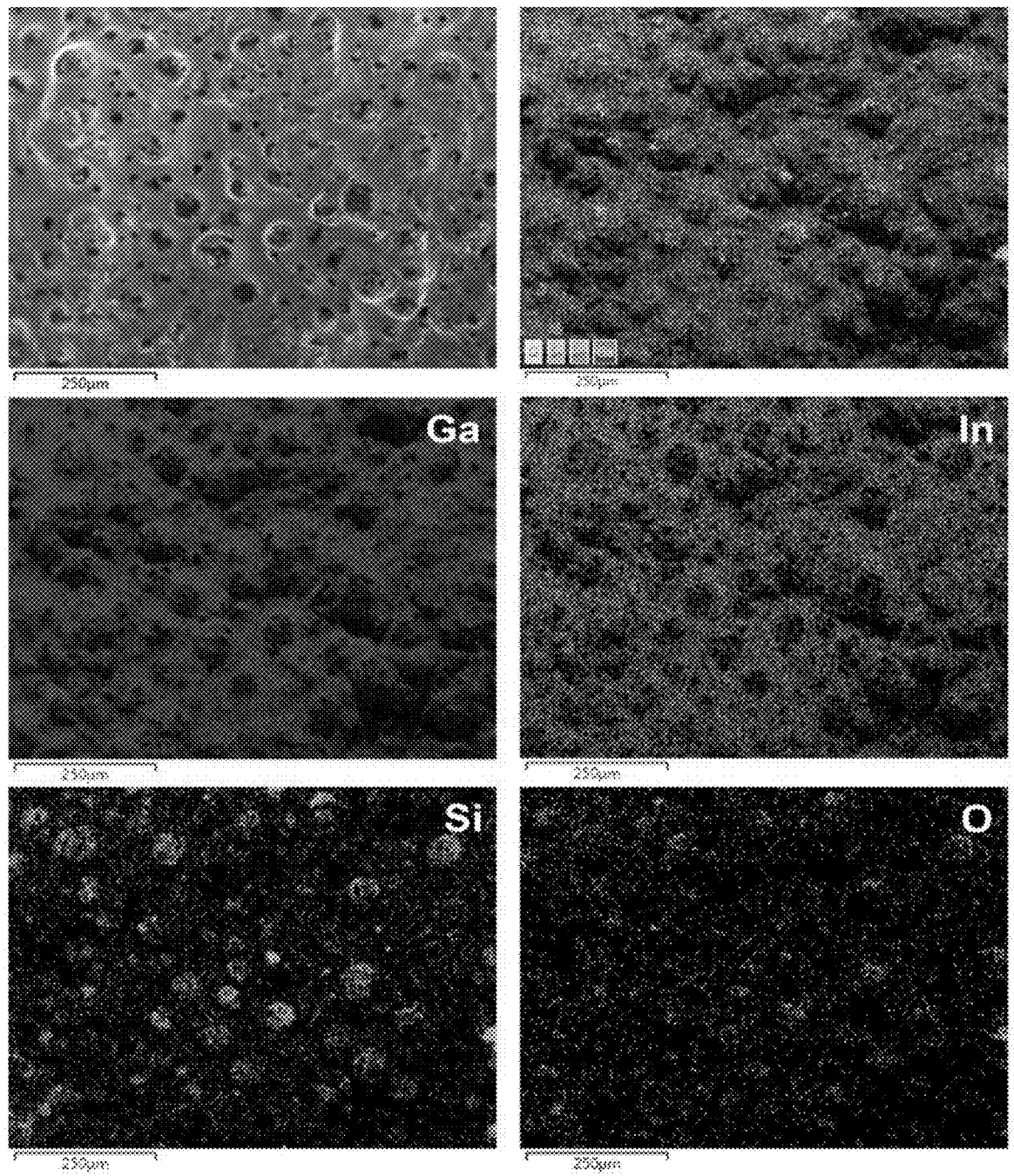
FIG. 9 depicts scanning electron microscope (SEM) image and energy spectrum mapping of liquid metal mixed with 0.35 wt. % $SiO_2$ microspheres (radius 40 μm).
Figure 10:
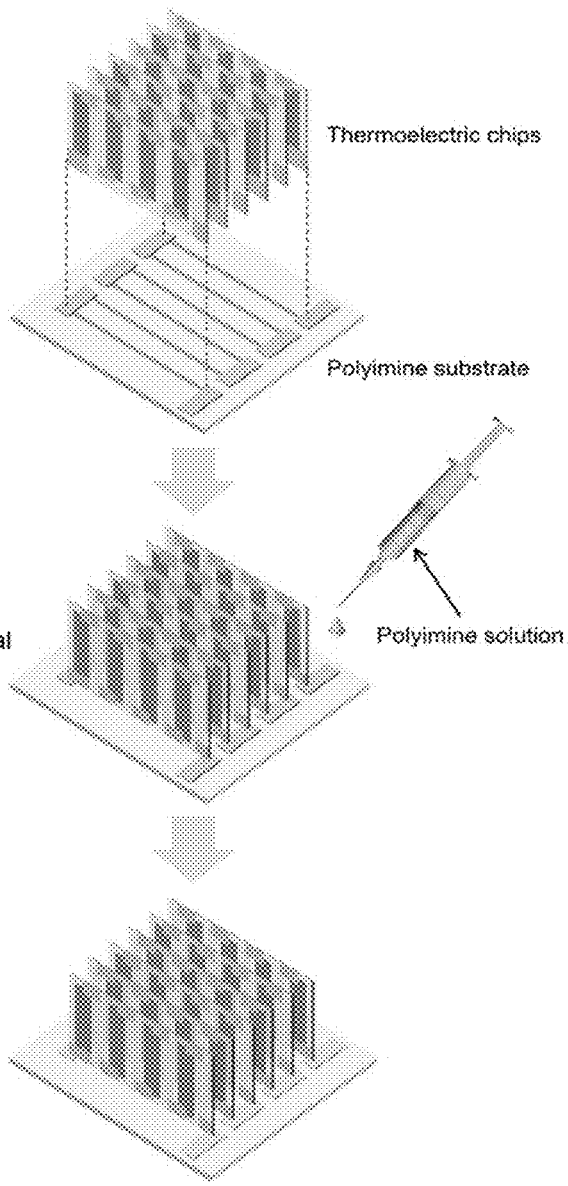
FIG. 10 depicts a schematic illustration of step-by-step fabrication processes of thermoelectric generators.

The TEG is composed of modular thermoelectric chips, liquid metal as electrical wiring and dynamic covalent thermoset polyimine as both the substrate and encapsulation for liquid metal wiring (FIG. 1). Polyimine can be synthesized by crosslinking three commercially available compounds, terephthalaldehyde, 3,3'-Diamino-N-methyldipropylamine and tris(2-aminoethyl)amine (FIG. 6). To fabricate the thermoelectric chips, thin film Bi and Sb chalcogenides were deposited onto polyimide films using a thermal evaporator, serving as the n-legs and p-legs, respectively (FIG. 7). The sizes of n-legs and p-legs were determined by a power conversion efficiency optimization process (FIG. 25). To improve crystallinity and performance, the thermoelectric films were then treated at 320° C. for 26 min in argon atmosphere. Then Au—Ge electrodes were deposited using a thermal evaporator to form connections between n-legs and p-legs, which finishes the fabrication of thermoelectric chips (FIGS. 7 and 8). The process of assembling modular thermoelectric chips into TEGs is schematically described in FIG. 1. It started with laser cutting a polyimine substrate to create slots (FIG. 8), followed by screen printing patterned liquid metal electrical wirings (FIGS. 8 and 9). Then the modular thermoelectric chips were inserted into the slots of the polyimine substrate, and a small amount of the polyimine solution (terephthalaldehyde+3,3'-Diamino-N-methyldipropylamine+tris(2-aminoethyl)amine in methanol) was applied to bond the thermoelectric chips with the substrate and to encapsulate the liquid metal wiring. The inset of FIG. 1, Panel (A) presents an exploded view of the device design, and FIG. 1, Panel (B) shows an optical image of the assembled TEG device.

Thanks to the bond exchange reactions within the dynamic covalent thermoset polyimine network and flowability of liquid metal electrical wiring, this TEG is self-healable, recyclable, and Lego-like reconfigurable, as schematically illustrated in FIG. 1. Furthermore, this TEG has excellent mechanical properties. It can be bent (FIG. 1, Panel (C)), stretched (FIG. 1, Panel (D)), and worn on a finger (FIG. 1, Panel (E)) while functioning.

Power Output and Thermoelectric Endurance

Figure 2:
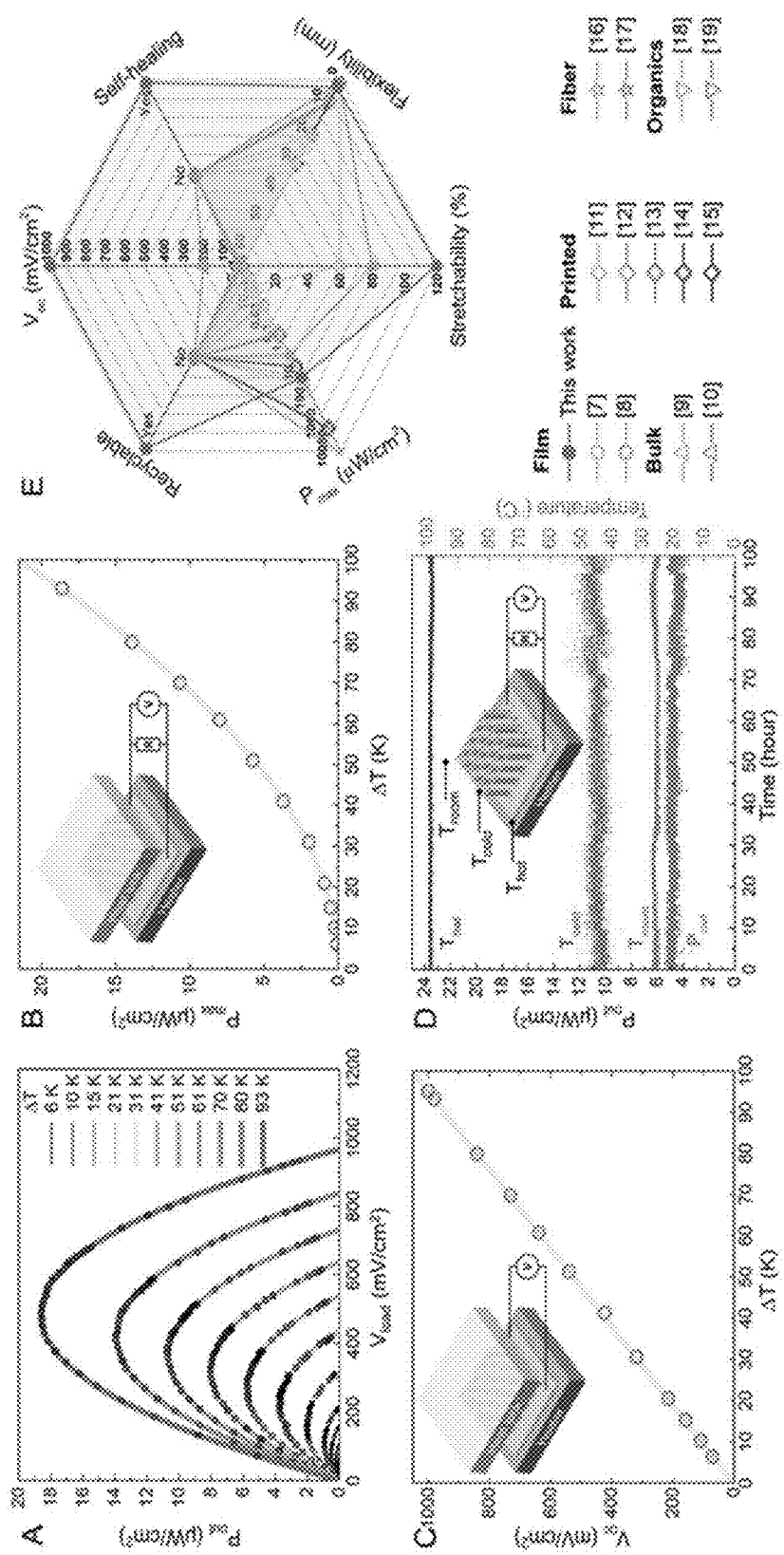
FIG. 2 depicts output and endurance of TEGs. Panel (A) depicts power generation ($P_{out}$) as a function of output voltage ($V_{load}$) at various temperature differences ($\Delta T$), with cold side temperature ($T_{cold}$) kept at 20° C. The black points are measurement data. Panel (B) depicts maximum power generation ($P_{max}$) versus temperature difference. Panel (C) depicts open-circuit voltage ($V_{oc}$) versus temperature difference. The solid lines in Panels (A) and (B) are fitting curves using parabolic functions. The solid line in Panel (C) is a linear fitting curve. Panel (D) depicts a 100-hour endurance test with the hot side temperature ($T_{hot}$) kept at 100° C. The cold side was natural convection, and the room temperature ($T_{room}$) was around 26° C. Panel (E) depicts performance comparison between this TEG and other flexible TEGs reported in the literature. Flexibility refers to the minimum bending radius of TEGs experimentally demonstrated in the literature.
Figure 11:
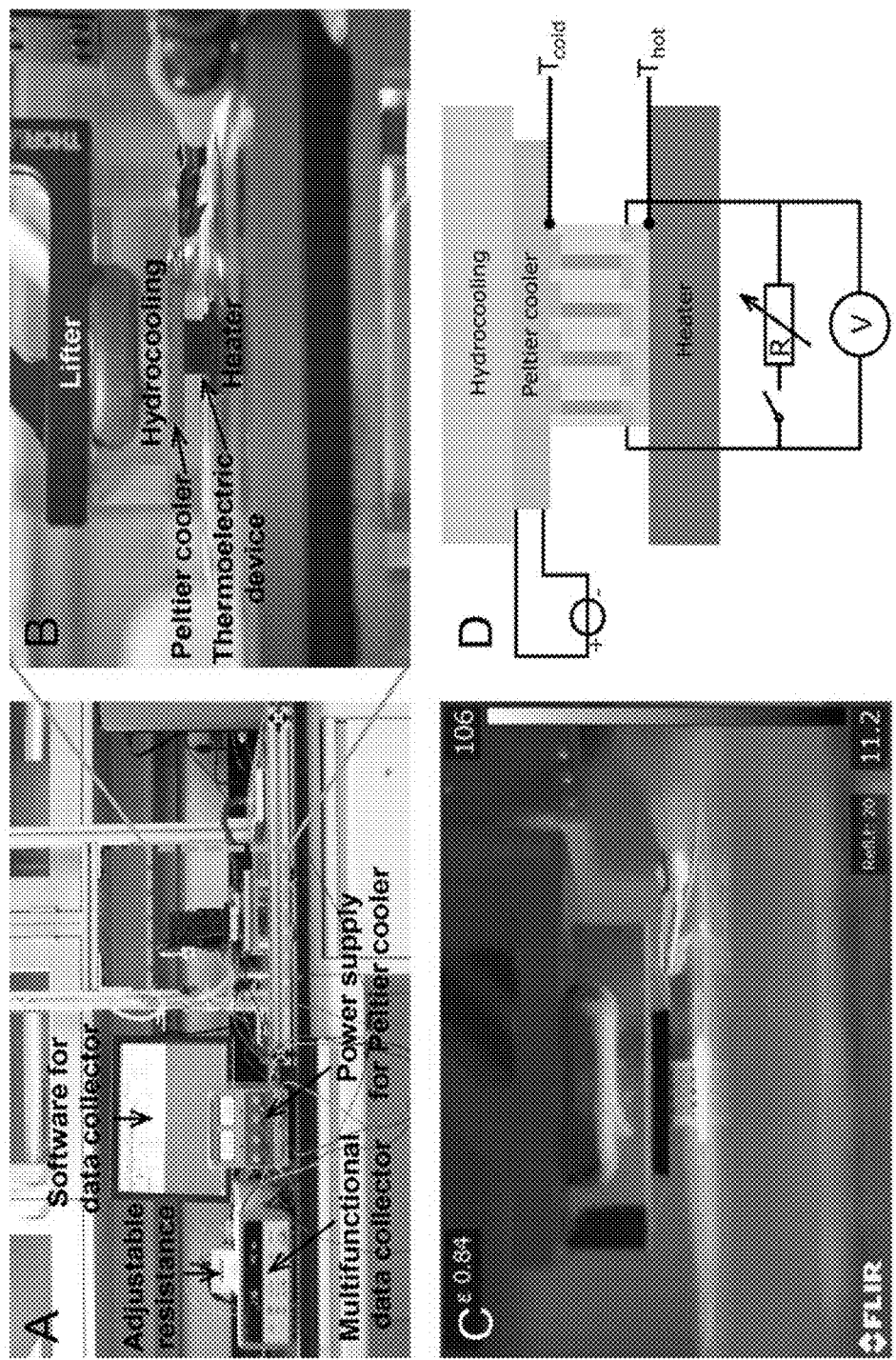
FIG. 11 depicts a testing platform for the output of TEGs. Panel (A) depicts overall testing setup. Panel (B) depicts a closer view of the cross section. The two-stage coolers can accurately control the cold side temperature of the TEG from 0° C. to room temperature. Panel (C) depicts infrared image of Panel (B). Panel (D) depicts a schematic of the testing setup.
Figure 12:
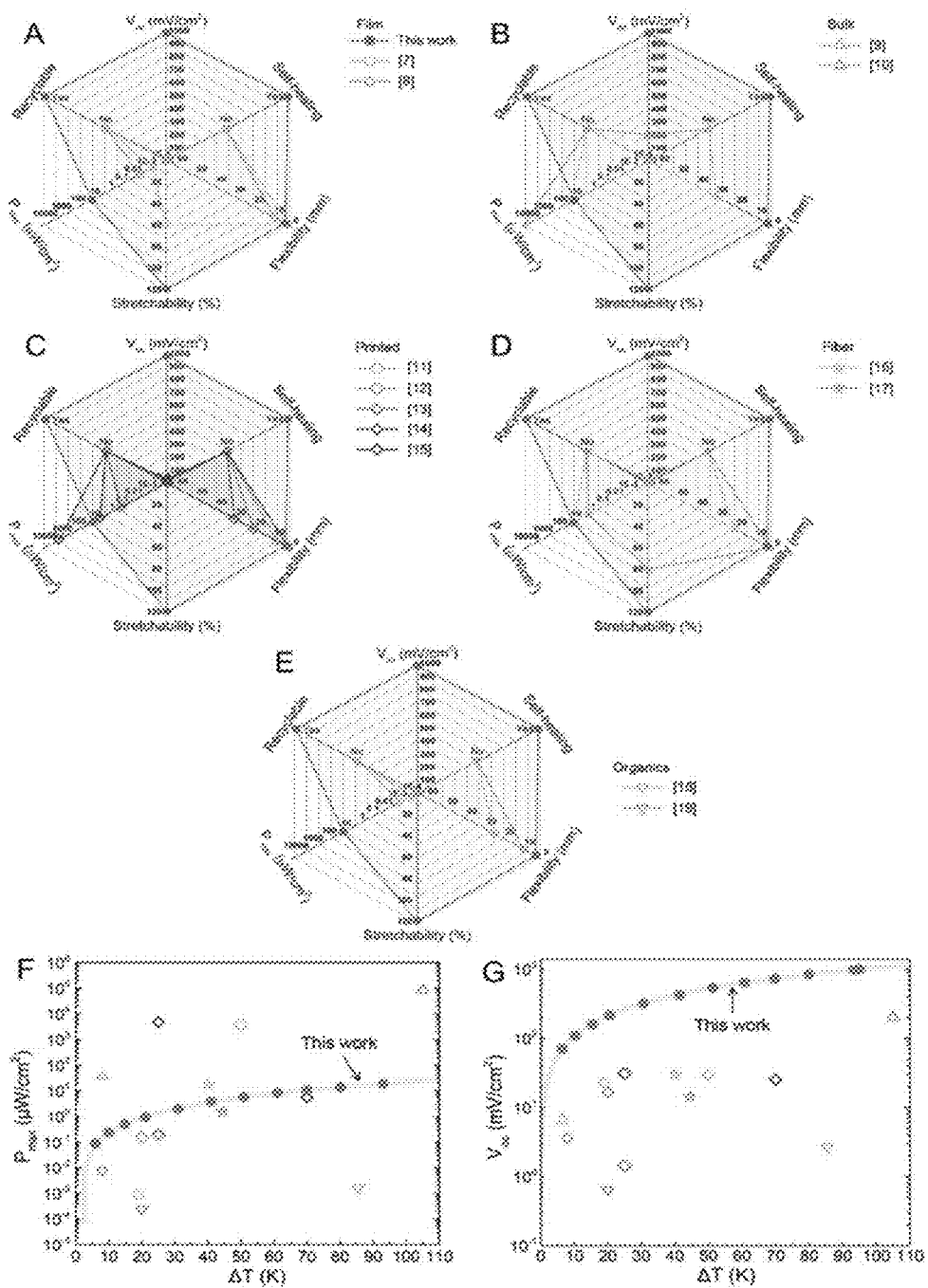
FIG. 12 depicts performance comparisons between the TEG in this work and other flexible TEGs reported in the literature. Panel (A) depicts film comparisons. Panel (B) depicts bulk comparisons. Panel (C) depicts printed comparisons. Panel (D) depicts fiber comparisons. Panel (E) depicts organics comparisons. Temperature difference ($\Delta T$) dependent (Panel (F)) max power densities $P_{max}$ and (Panel (G)) open-circuit voltage per unit area $V_{oc}$. The solid lines in Panels (F) and (G) are the parabolic and linear fitting curves for measurement data, respectively.

The power and voltage output of the TEG with thermoelectric legs under various temperature differences were tested using a laboratory setup (FIG. 11). FIG. 2 exhibits the power generation ($P_{out}$) and open-circuit voltage ($V_{oc}$) per unit area at temperature differences ($\Delta T$) ranging from 6 K to 95 K when the cold side temperature is fixed at 20° C. The relation between power generation ($P_{out}$) and output voltage ($V_{load}$) at different temperature differences is given in FIG. 2, Panel (A). FIG. 2, Panel (B) shows that the max power generation $P_{max}$ increases with temperature difference $\Delta T$, and reaches 19 μW/cm2 at $\Delta T$=93 K. The open-circuit voltage per unit area $V_{oc}$, as displayed in FIG. 2, Panel (C), increases linearly with temperature difference, and reaches 1 V/cm$^2$ at $\Delta T$=95 K, which is remarkably higher than other flexible TEGs reported in literature. FIG. 2, Panel (D) presents the endurance test results of this TEG. The power generation of the TEG remained stable for 100 hours when the hot side was fixed at 100° C. and the cold side was subject to indoor natural convection. The results indicate excellent thermal and electrical endurance of this TEG. FIG. 2, Panel (E) shows a comparison with flexible TEGs reported in literature on six performance indexes, including max power density, max open-circuit voltage, flexibility (measured in bending radius), stretchability, self-healing and recyclability (refer to FIGS. 12 and 26 for details). The TEGs reported here show flexibility and max power density comparable to other flexible TEGs, but the stretchability and max open-circuit voltage are much better. In addition, our TEGs are self-healable, recyclable, and Lego-like reconfigurable (to be demonstrated later), and these properties have not been demonstrated in TEG systems yet.

Wearable TEG and Mechanical Properties

Figure 3:
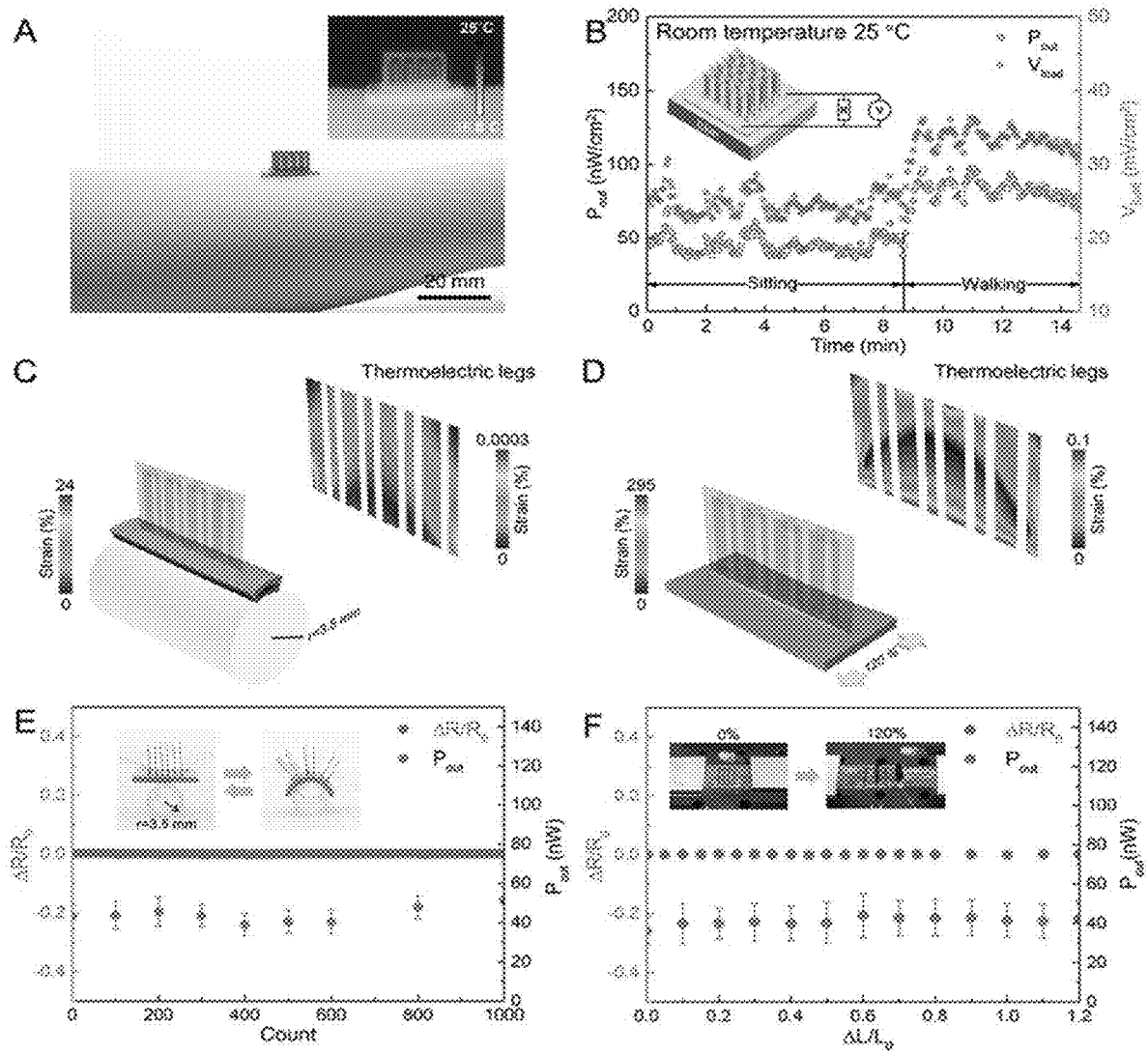
FIG. 3 depicts wearable energy harvesting and mechanical properties of the TEG. Panel (A) depicts optical and infrared (inset) images of a TEG attached on an arm. Panel (B) depicts power generation ($P_{out}$) and output voltage ($V_{load}$) of the TEG with 112 thermoelectric legs on the human skin when the wearer was sitting and walking. The cold side was natural convection. FEM simulated strain distribution contours in the TEG and thermoelectric legs (inset) when the TEG is bent to a radius of 3.5 mm (Panel (C)) and stretched by 120% (Panel (D)). Panel (E) depicts relative electrical resistance change and power generation stability over 1000 bending cycles. The inset shows optical images of the TEG when it is flat and bent. The bending radius r=3.5 mm, $R_0$ is the original resistance, and $\Delta R$ is the change in resistance. Panel (F) depicts relative electrical resistance change and power generation versus stretching ratio ($\Delta L/L_0$). For output power ($P_{out}$) measurements in Panels (E) and (F), the hot side temperature was kept at 41° C., the cold side was natural convection, and the room temperature was around 26° C. The inset in Panel (F) shows optical images of a TEG during tension test, which is in series with a LED and a 4V DC source for visual demonstration (FIG. 16).
Figure 13:
FIG. 13 depicts images of on-arm performance testing of a TEG during (Panel (A)) sitting and (Panel (B)) walking.

This TEG has excellent mechanical flexibility and thus can be worn on human body for energy harvesting. FIG. 3, Panel (A) shows a TEG attached on a forearm at room temperature 136° C., and the inset gives the infrared measurement of temperature distribution across the device. FIG. 3, Panel (B) shows that this TEG device can generate an average power output density of 45 nW/cm$^2$ and 83 nW/cm$^2$ and average output voltage of 25 mV/cm$^2$ and 33 mV/cm$^2$ when the wearer was sitting and walking, respectively (FIG. 13). For the surface area of a typical sports wristband (6×25 cm$^2$), a power output of 12.5 μW and voltage output of 5 V can be generated when the wearer is walking, which is enough to directly drive most low-power sensor nodes with RF communication.

Figure 14:
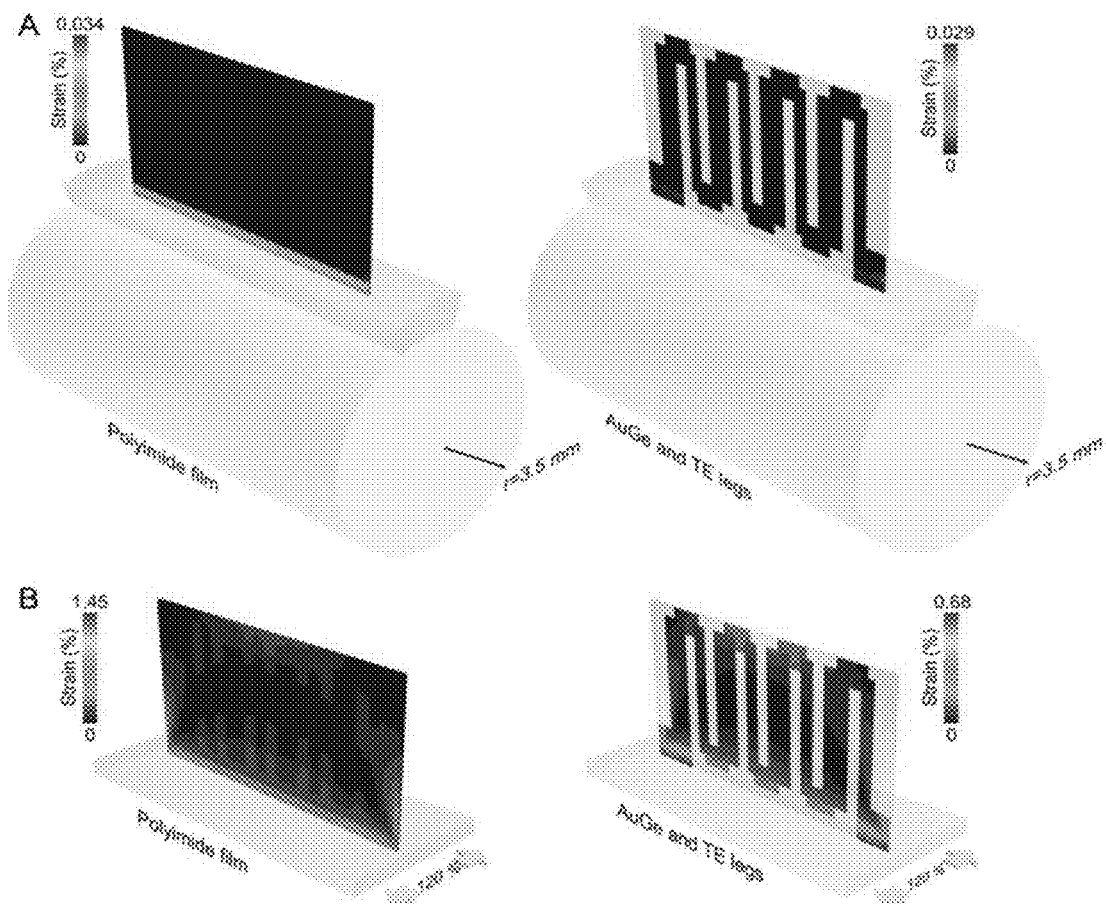
FIG. 14 depicts simulated strain distribution contours in the polyimide film, AuGe, and thermoelectric (TE) legs when a TEG is (Panel (A)) bent at a radius of 3.5 mm and (Panel (B)) stretched by 120%. All strains are below the failure limits of the corresponding materials.

For wearable devices, the mechanical properties are of paramount importance. To improve the mechanical flexibility and stretchability of the TEG, an innovative design of "soft motherboard-rigid plugin modules" (SOM-RIP) is introduced. This design can effectively separate the rigid and fragile TEG chips from the strains in the soft polyimine substrate during mechanical deformation. Finite element method (FEM) simulation results, as shown in FIG. 3, Panels (C) and (D), clearly prove the effectiveness of this SOM-RIP design on improving the mechanical properties of the TEG. FIG. 3, Panel (C) exhibits the max principal strain distribution contour in the TEG when it is bent to a radius of 3.5 mm. The inset gives the maximum strain in the thermoelectric legs to be 0.0003%. FIG. 3, Panel (D) shows the max principal strain distribution contour in the TEG when it is stretched by 120%. From the inset, the maximum strain in the thermoelectric legs is only 0.1%, which is below the fracture strain 0.15%) of thermoelectric materials. This SOM-RIP design yields a strain reduction ratio of 1200 times. The strain distribution contours in polyimide and AuGe due to bending and stretching are given in FIG. 14.

Figure 15:
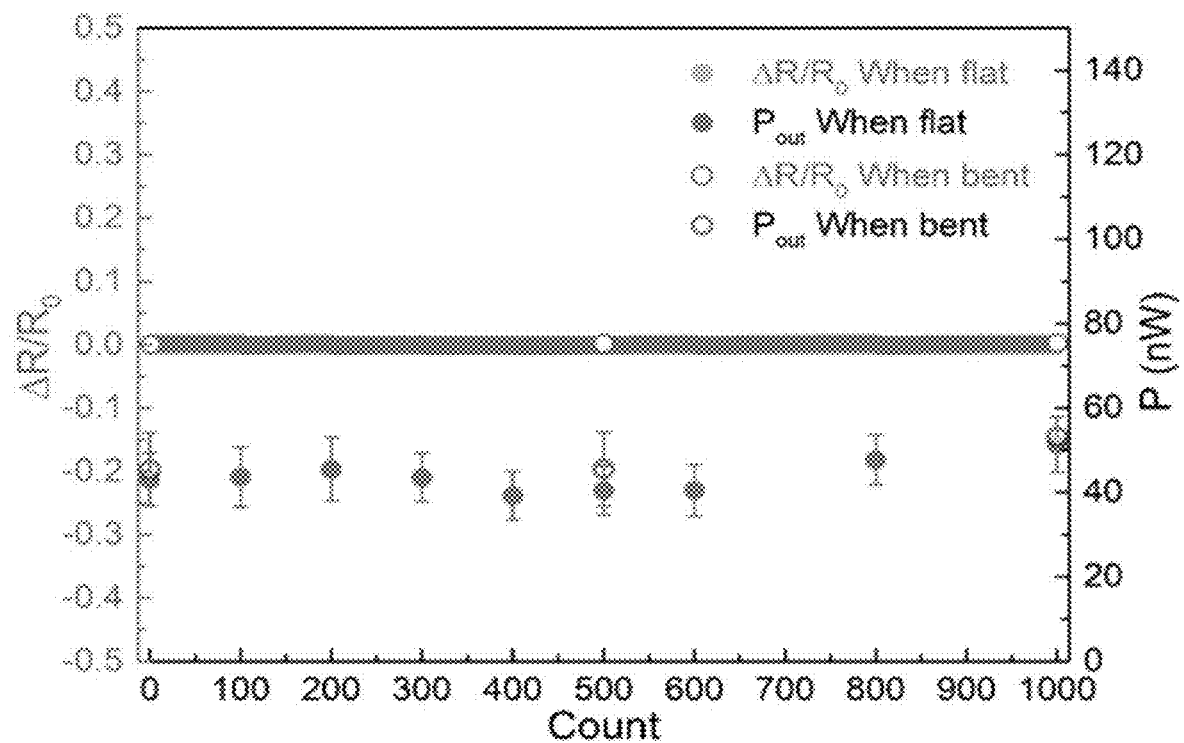
FIG. 15 depicts relative electrical resistance change ($\Delta R/R_0$) and power generation (P) stability over 1000 bending cycles with bending radius r=3.5 mm when the TEG is flat and bent. For the output power ($P_{out}$) measurements, the hot side temperature was kept at 41° C., the cold side was natural convection, and the room temperature was around 26° C.
Figure 16:
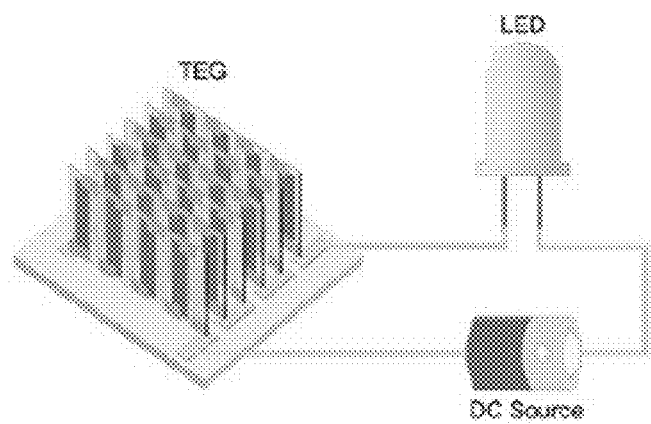
FIG. 16 depicts a schematic illustration of the circuit to visually exhibit that the TEG is undamaged when stretched, cut, recycled, or reconfigured.

To ensure mechanical robustness, cyclic bending test was conducted, with a bending radius of 3.5 mm. As shown in FIG. 3, Panel (E) and FIG. 15, the electrical resistance remains constant, and the power output doesn't show obvious variation. FIG. 3, Panel (F) presents the relative resistance change and power output versus mechanical stretching strain. Both resistance and power output show no noticeable change when the TEG device is stretched by up to 120%. This is also demonstrated by the inset, as the brightness of the LED when it is stretched by 120% is comparable to that when the TEG is not stretched (FIG. 16).

It is worth pointing out that the flexibility and stretchability of this TEG are limited along the direction parallel to the thermoelectric chips. However, TEGs with ultra-high flexibility and stretchability along one direction are well suited for cylindrical heat sources, such as arms, legs, and fingers for wearable applications, and industrial pipelines for waste heat harvesting.

Self-Healing, Recycling, and Lego-Like Reconfiguration

Figure 4:
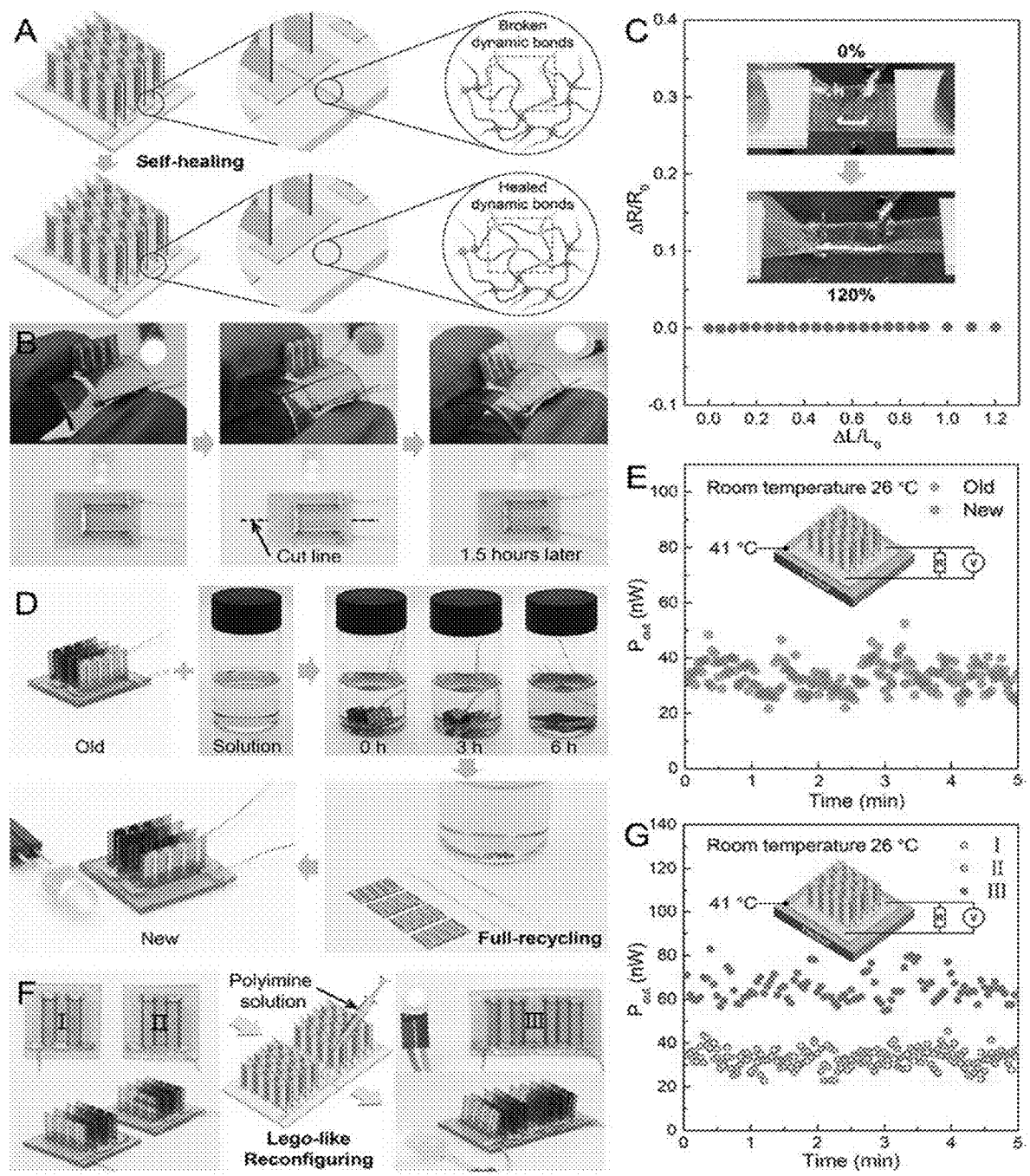
FIG. 4 depicts self-healing, recycling and Lego-like reconfiguration characteristics of the Polyimine substrate and TEG modules. Panel (A) depicts a schematic illustration of self-healing mechanism. Panel (B) depicts optical images of the TEG in a self-healing test. The original TEG is flexible and in series with a LED and a 4V DC source (left subpanel). When the liquid metal electrical wiring and polyimine substrate are both cut broken, the LED turns off (top middle subpanel). When the two surfaces at the broken site are brought into contact, the liquid metal electrical wiring heals immediately, leading to the LED to turn on (bottom middle subpanel). After 1.5 hours, the polyimine substrate completely heals and regains mechanical robustness (right subpanel). Panel (C) depicts relative electrical resistance change ($\Delta R/R_0$) of a self-healed TEG versus stretching ratio. The inset shows optical images of the self-healed TEG during tension test. Panel (D) depicts optical images of the TEG at different recycling steps. The new TEG is in series with a LED and a 4V DC source (bottom left subpanel). Panel (E) depicts power generation comparison between the old TEG and the recycled new TEG. Panel (F) depicts the Lego-like reconfiguration of two separate TEGs (I and II) into a new functional TEG (III). The new TEG (III) is in series with a LED and a 4V DC source (right subpanel). Panel (G) depicts power generation comparison between TEGs I, II and III.
Figure 17:
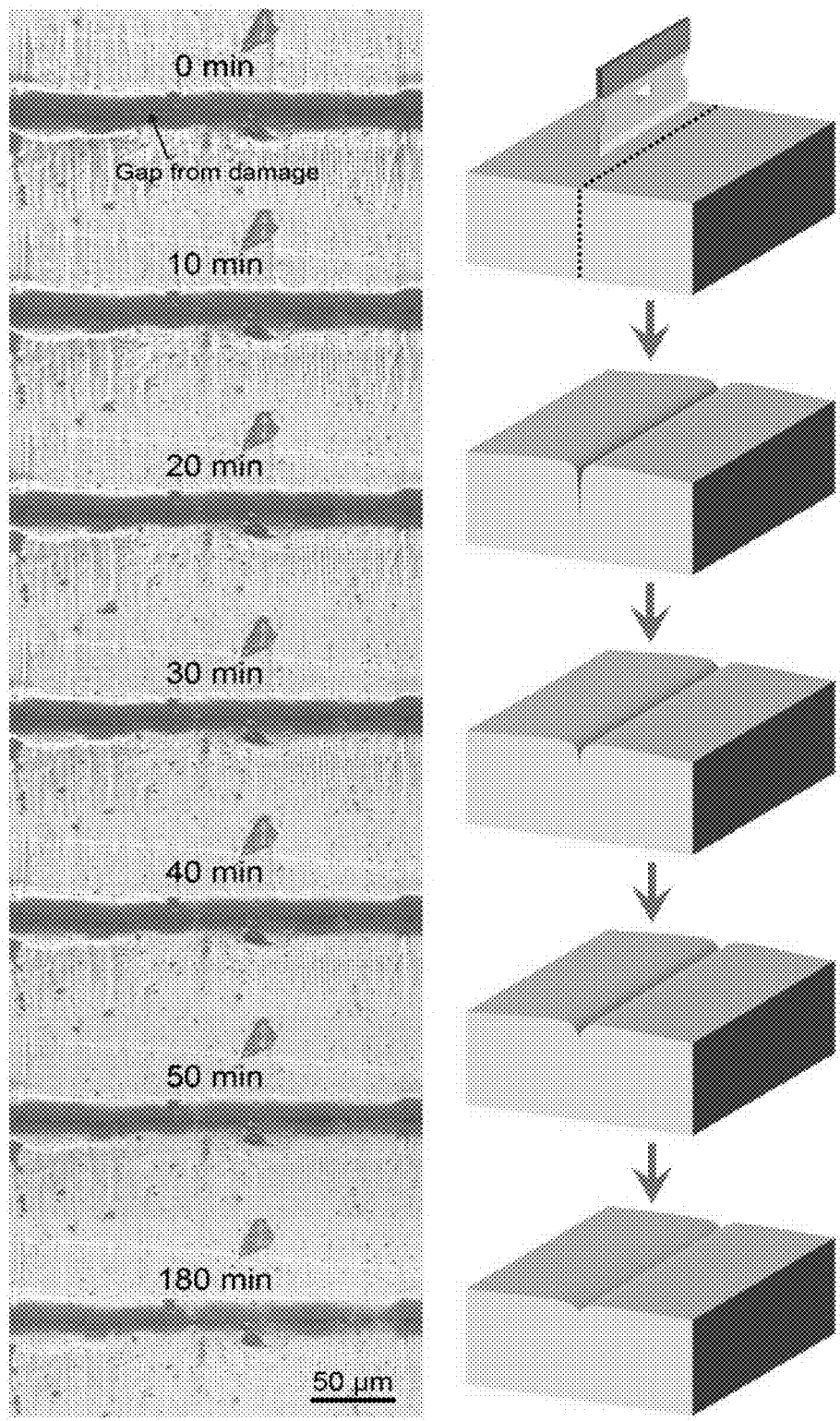
FIG. 17 depicts optical microscope images and schematic illustration of the self-healing process at room temperature.

In this TEG, the flowability of liquid metal wiring and bond exchange reactions within the polyimine network provide excellent self-healing capability to the device. FIG. 4, Panel (A) schematically illustrates the self-healing process and mechanism. After the liquid metal wiring and polyimine substrate are cut broken (top subpanel of FIG. 4, Penal (A)), the broken interfaces can be brought back in contact. The liquid metal wiring immediately regains electrical conductivity, due to its fluid like behavior. Bond exchange reactions promote generation of new covalent bonds at the interface, leading to healed TEG device with both mechanical robustness and electrical functionality (bottom subpanel of FIG. 4, Panel (A)). FIG. 4, Panel (B) experimentally demonstrate this process using a TEG device with two thermoelectric modules. When the liquid metal wiring and polyimine substrate are cut broken, the LED turns off (top middle subpanel of FIG. 4, Panel (B)). Bringing the interfaces back to contact leads to immediate healing of the electrical conductivity in the liquid metal wiring, and the LED turns on again (bottom middle subpanel of FIG. 4, Panel (B)). After 1.5 hours healing at room temperature, sufficient covalent bonds are created at the interface, leading to a mechanically robust self-healed TEG that can be bent without affecting power output (right subpanel of FIG. 4, Panel (B)). Optical microscope images in FIG. 17 exhibit the healing process of a cut in polyimine over time. The self-healed TEG demonstrates stretchability comparable to the original device, as it can be stretched by 120% without affecting the electrical resistance (FIG. 4, Panel (C)).

Excessive amine monomers can cause depolymerization of polyimine networks into monomers and oligomers soluble in organic solvents, leading to excellent recyclability of polyimine based devices. FIG. 4, Panel (D) shows the recycling process of a TEG device. An old TEG is soaked in the recycling solution (3,3'-Diamino-N-methyldipropylamine and tris(2-aminoethyl)amine in methanol) (top left subpanel of FIG. 4, Panel (D)). After 6 hours at room temperature, the polyimine substrate completely depolymerizes into oligomers and monomers that are soluble in methanol (top right subpanel of FIG. 4, Panel (D)). Then the other components including thermoelectric modules, conductors and liquid metal can be separated from the chemical solution (bottom right subpanel of FIG. 4, Panel (D)). The recycled solution can be fully reused to synthesize a new polyimine film by proportionally adding terephthalaldehyde and methanol. A new functional TEG can be fabricated by using all components recycled from the old TEG (bottom left subpanel of FIG. 4, Panel (D)). As demonstrated in FIG. 4, Panel (E), the power output of the new TEG is comparable to the old TEG.

Figure 18:
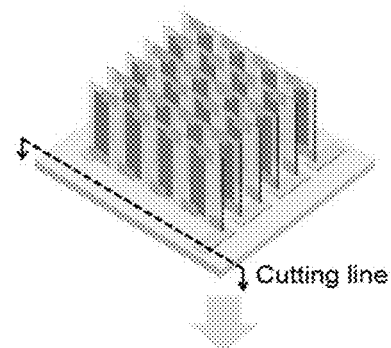
FIG. 18 depicts a schematic illustration of step-by-step reconfiguration processes.
Figure 18:
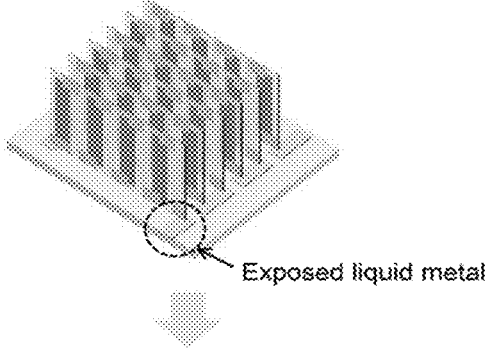
Figure 18:
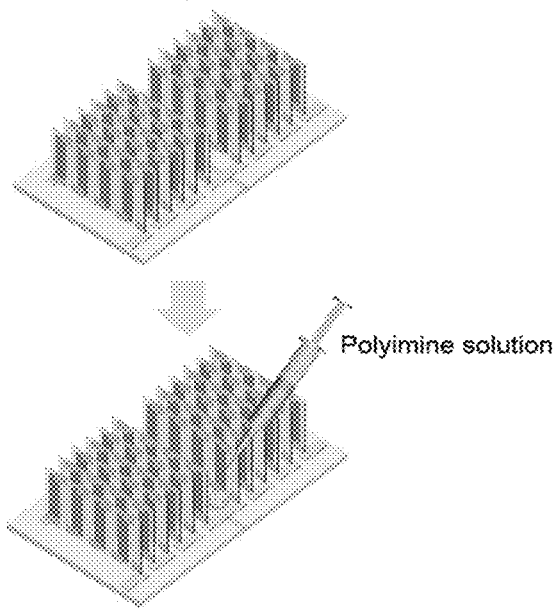
Figure 19:
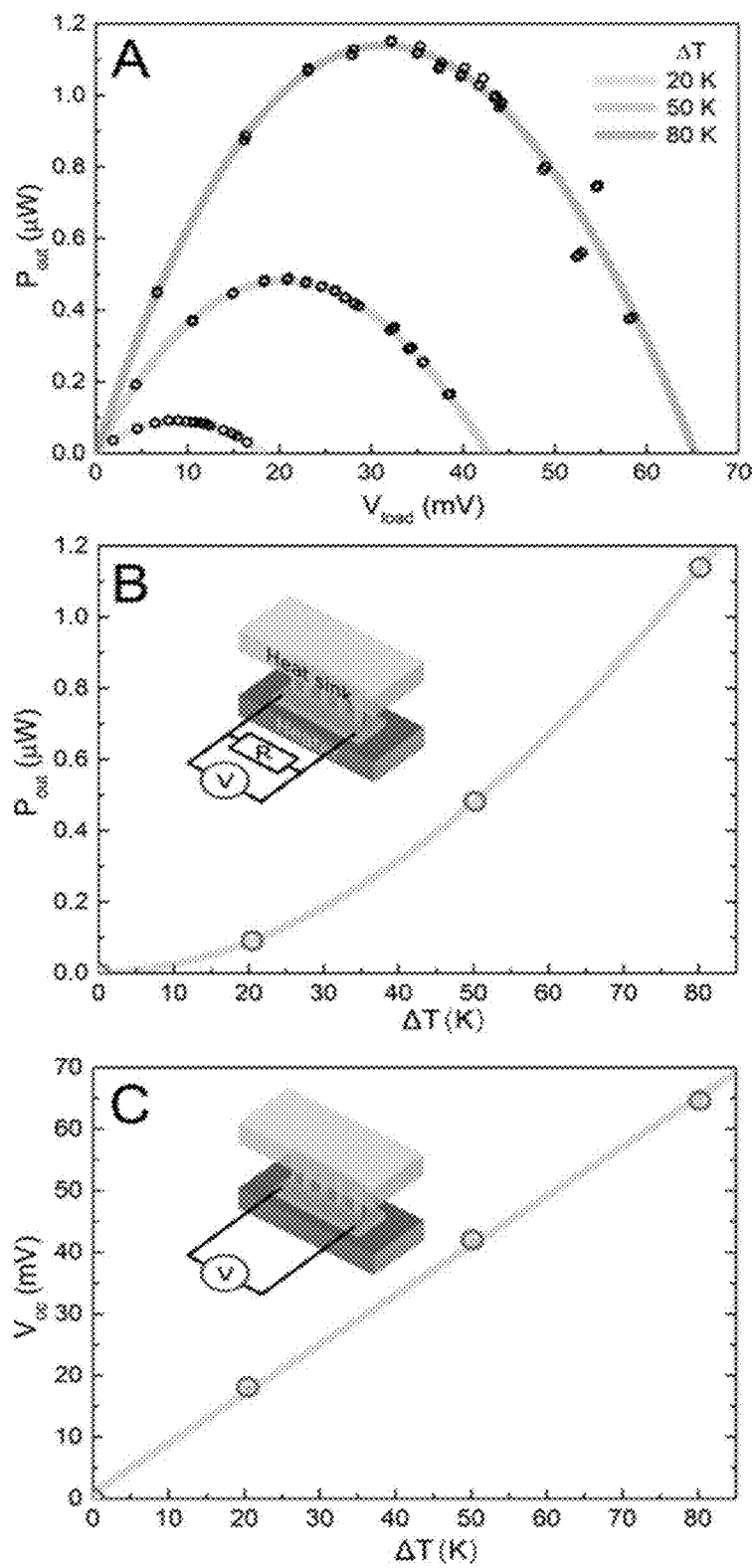
FIG. 19 depicts output performance of one thermoelectric chip. Panel (A) depicts power generation ($P_{out}$) as a function of output voltage ($V_{load}$) at various temperature differences. The black points are measurement data. The cold side temperature ($T_{cold}$) was kept at 20° C. Panel (B) depicts maximum power generation at various temperature differences. Panel (C) depicts open-circuit voltage ($V_{oc}$) at various temperature differences. The solid lines in Panels (A) and (B) are fitting curves using parabolic functions. The solid line in Panel (C) is a linear fitting curve.

Not only self-healable and recyclable, this TEG device is also Lego-like reconfigurable, thanks to the SOM-RIP construction that combines dynamic covalent thermoset polyimine and liquid metal wiring. FIG. 4, Panel (F) demonstrates the reconfiguration of two separate TEG devices (device I and II) into a new TEG device (device III). The Lego-like reconfiguration process starts with cutting off one terminal of devices I and II to expose the liquid metal wiring (left subpanel of FIG. 4, Panel (F)), followed by bringing the exposed terminals of the two TEGs into physical contact. Then applying and curing a small amount of polyimine solution (terephthalaldehyde+3,3'-Diamino-N-methyldipropylamine+tris(2-aminoethyl)amine in methanol) at the joint of the two TEGs completely heals the interface (middle subpanel of FIG. 4, Panel (F)). The new TEG is fully functional (right subpanel of FIG. 4, Panel (F)). This process is schematically illustrated in detail in FIG. 18. As shown in FIG. 4, Panel (G), the power output of the new TEG III is equal to the sum of I and II, indicating that the Lego-like reconfiguring process is effective without performance degradation. It is worth noting that during this reconfiguration process, it is not necessary to apply polyimine solution, but more time is required for generating enough covalent bonds at the joint interface. The Lego-like reconfiguration capability allows users to customize TEGs using modules in series or parallel for targeted form factors, constructions, output voltage and power based on specific thermal conditions and output of thermoelectric chips (FIG. 19). The Lego-like reconfigurable TEG can also be integrated into a sensor system based on similar self-healing substrate to form a self-powered autonomous sensor system.

Enhancing Outdoor Performance of TEG with Metamaterial Film

Figure 5:
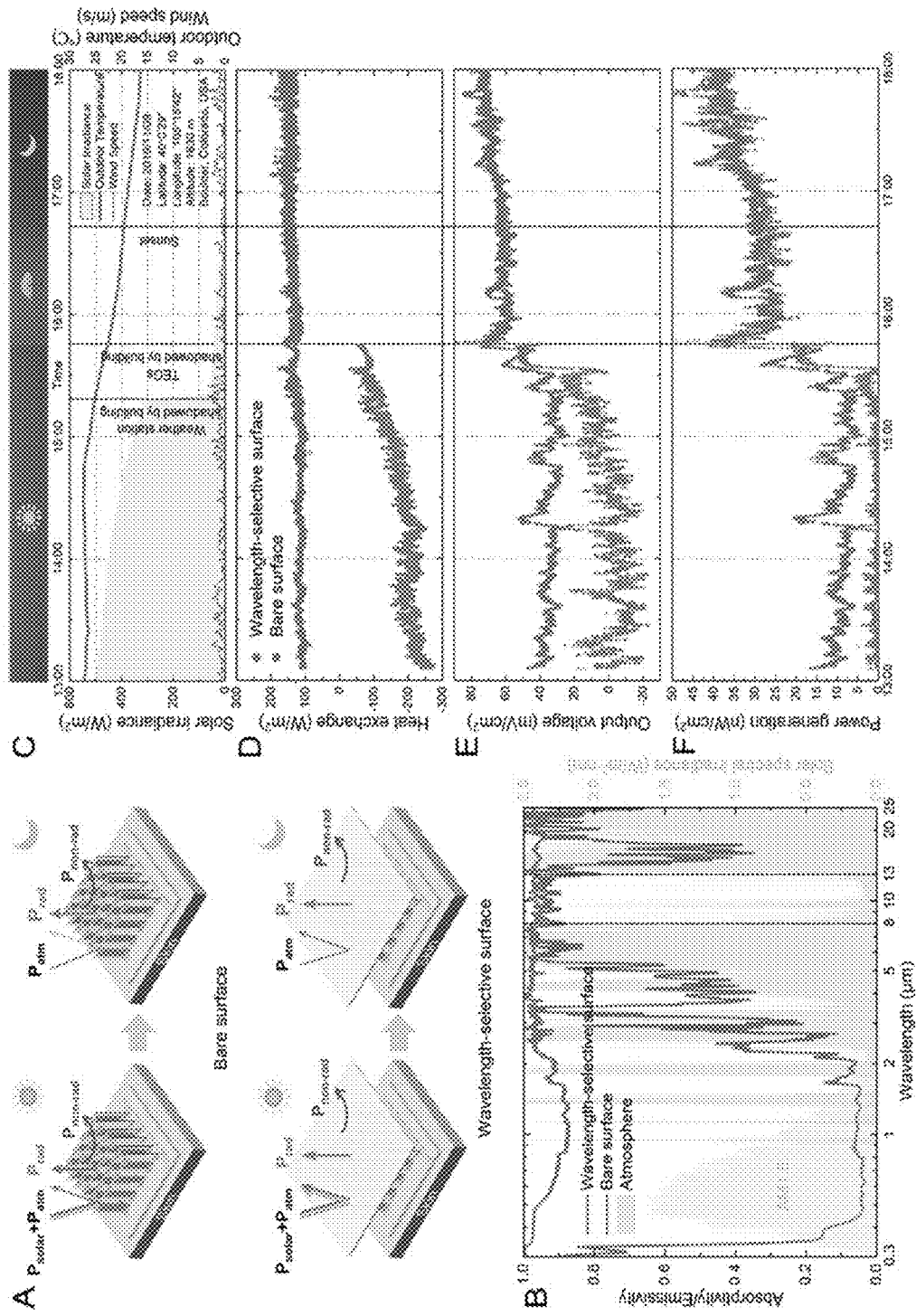
FIG. 5 depicts outdoor performance enhancement with wavelength-selective metamaterial films. Panel (A) depicts a schematic illustration of heat transfer processes of TEGs with bare surface (top subpanel) and wavelength-selective surface (bottom subpanel) during the daytime and nighttime. $P_{solar}$ and $P_{atm}$ are the solar irradiation power and atmospheric radiation power on the surface, respectively, P the thermal radiation power from the surface, and $P_{non-rad}$ is the non-radiative heat transfer (convection and conduction) between the surface and ambient. Panel (B) depicts measured absorptivity/emissivity of the bare surface and wavelength-selective surface from 300 nm to 25 The absorptivity/emissivity of the atmosphere (gray block) and power density of spectral solar irradiance (yellow block, air mass 1.5) are also included. Both the bare surface and wavelength-selective surface have strong emission between 8 and 13 μm (atmospheric transmission window), indicating excellent radiative cooling performance. The bare surface has strong absorption at full solar spectrum (>0.87) and other infrared bands (>0.96), while the wavelength-selective surface has much weaker absorption at solar spectrum than at infrared bands. Panel (C) depicts solar irradiance, outdoor temperature and wind speed measured by a weather station from 13:00 to 18:00 (Nov. 9, 2019, Boulder, CO, USA). Total surface heat exchange (Panel (D)), output voltage (Panel (E)) and power generation (Panel (F)) of the TEGs with bare surface and wavelength-selective surface at the cold side from 13:00 to 18:00.

The solar irradiance, ambient radiation, and non-radiative heat exchange can affect the wearable TEG performance during outdoor activities (top subpanel of FIG. 5, Panel (A)). The energy balance of the TEG's cold side that is exposed to the ambient can be expressed as:

$$Q_{surf} = P_{non-rad} + P_{rad} - P_{abs} = h_c(T_c - T_{amb}) + \kappa_B \varepsilon_{emit}(T_c^4 - T_s^4) - P_{solar}\varepsilon_{abs},$$

where $Q_{surf}$ is the total heat flow on the cold side surface per unit area, $P_{non-rad}$ and $P_{rad}$ are the nonradiative heat transfer and thermal radiation exchange per unit area between the cold side surface and the ambient, respectively, $P_{abs}$ is the absorbed solar irradiation power per unit area, $P_{solar}$ is the solar irradiation power per unit area, $\varepsilon_{emit}$ and $\varepsilon_{abs}$ it and are the effective emissivity and effective absorptivity of the surface, respectively. The emissivity and absorptivity can be used to evaluate the thermal radiation of the cold side surface and its absorption of the solar irradiation, as shown in Eq. (1). FIG. 5, Panel (B) shows the measured wavelength-dependent emissivity/absorptivity of the TEG surface (bare surface). The bare TEG surface has strong absorption (>0.87) in the solar spectra (0.3~2.5 µm), indicating that the surface can be heated up by solar irradiance which significantly restricts its heat dissipation. To enhance the outdoor TEG performance, the key is to modify the cold side surface to be wavelength-selective for more efficient heat dissipation. Such surface must possess two characteristics: 1) low absorptivity in the solar spectra, and 2) high emissivity in the infrared range, especially in the atmospheric transmission window (8~13 µm), which allows the cold side to emit infrared radiation to the universe through the atmosphere, namely radiative sky cooling. Therefore, a glass-polymer hybrid metamaterial film that can provide both characteristics is chosen and applied as a cover on the cold side surface of the TEG (bottom subpanel of FIG. 5, Panel (A)), which yields an efficient wavelength-selective surface. As shown in FIG. 5, Panel (B), the measured wavelength-dependent emissivity/absorptivity of the wavelength-selective surface clearly shows much lower absorption than the bare surface in the solar spectra (0.3~2.5 µm), and comparable emissivity in the atmospheric transmission window (8~13 µm). The detailed design and fabrication of the metamaterial can be found in our previous work.

Figure 20:
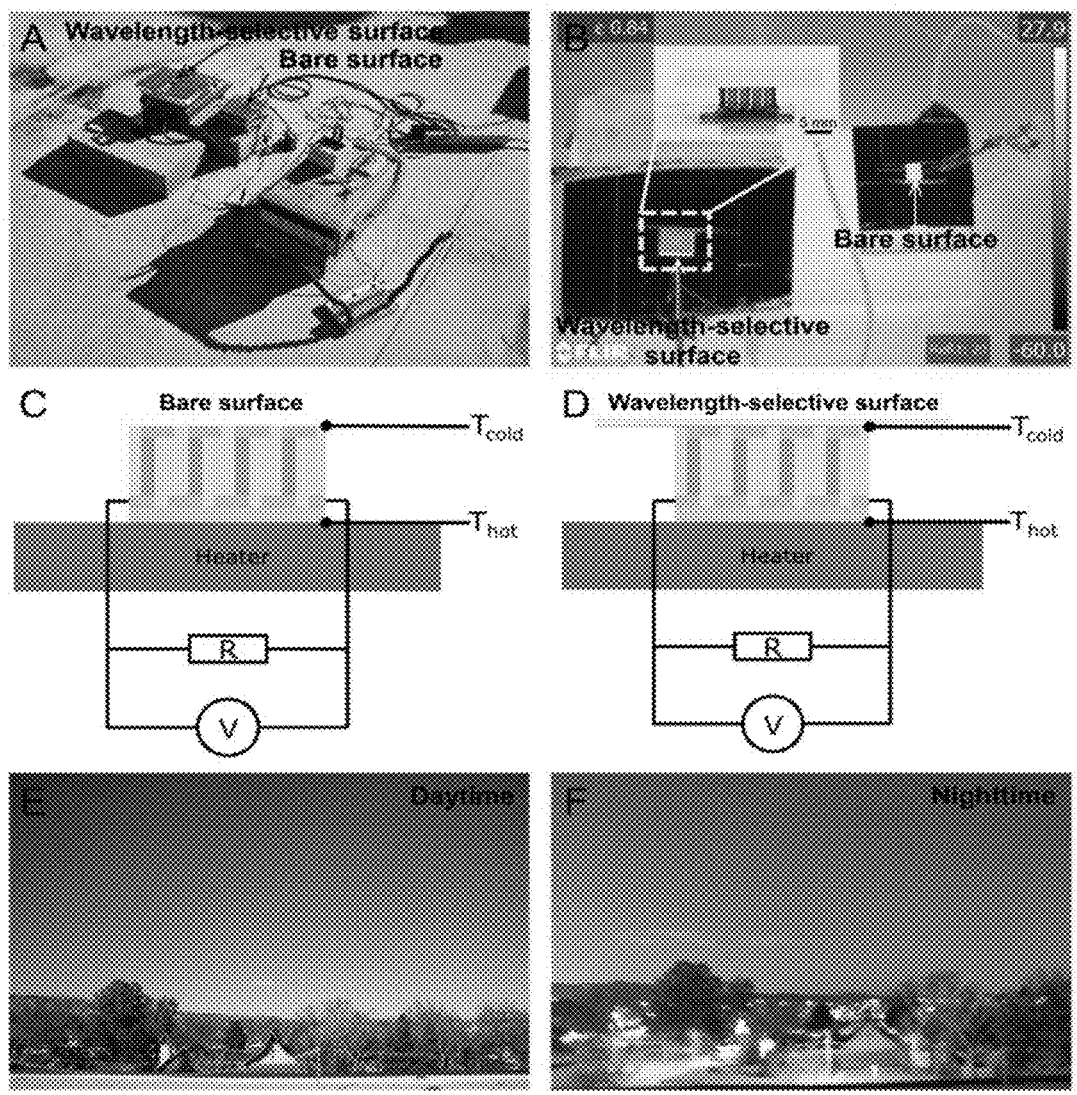
FIG. 20 depicts outdoor performance testing setup for TEGs. Panel (A) depicts an optical image of the entire testing setup. Panel (B) depicts infrared image of the testing setup. The inset is an image of a TEG with a wavelength selective surface. The wavelength-selective film was attached on the cold side of the TEG by using a pressure-sensitive tape. Panels (C, D) depict schematics of the testing setup. Panels (E, F) depict photos of sky conditions during the testing day. To simulate the human skin, the temperature of the heaters was set at 35° C.
Figure 21:
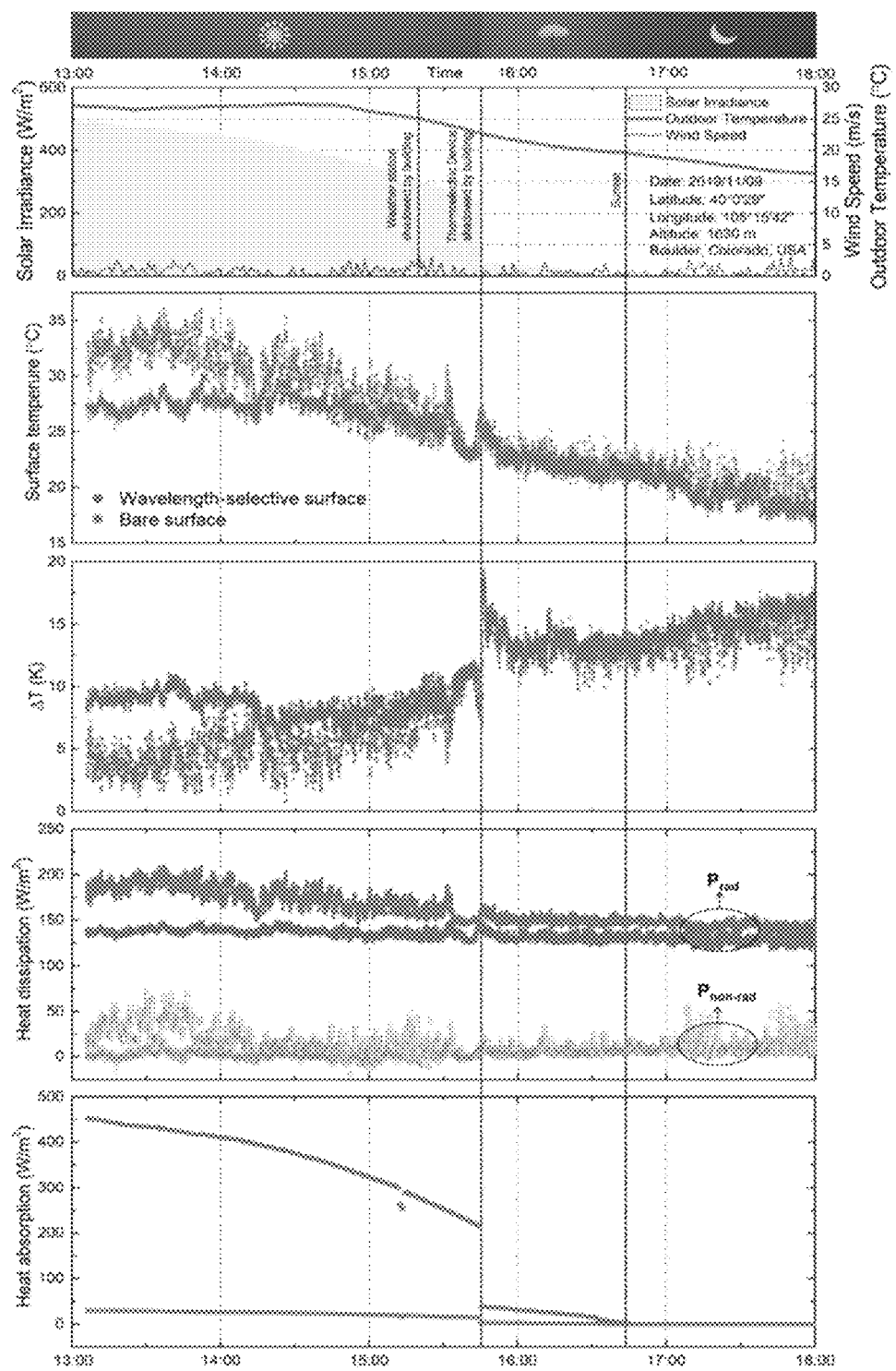
FIG. 21 depicts surface temperature ($T_s$), the temperature difference between the hot side and cold side of the TEGs ($\Delta T$), calculated radiative ($P_{rad}$) and nonradiative ($P_{non-rad}$) heat dissipation and heat absorption. The solar irradiation between 15:18 and 15:45 is obtained by fitting the data between 13:00 and 15:18.

To quantitatively explore the effects of solar irradiance and radiative cooling on thermoelectric performance, TEGs were tested outdoors with both bare surface and wavelength-selective surface at the cold side on a sunny day using a laboratory setup (FIG. 20). The measured solar irradiance, outdoor temperature and wind speed from 13:00 to 18:00 are presented in FIG. 5, Panel (C). The sudden drop of the measured solar irradiance at 15:18 is because the weather station was shadowed by an adjacent building, and the TEG devices were shadowed by the building at 15:45. The heat exchange on the two types of surfaces can be calculated based on the measured data (FIG. 21). As shown in FIG. 5, Panel (D), the TEG with bare surface at the cold side has negative heat exchange between 13:00 and 15:45, because the solar absorption on the bare surface is more than the total heat dissipation by radiative and non-radiative heat transfer. This leads to the output voltage of the TEG with bare surface fluctuating around zero (FIG. 5, Panel (E)), and the power generation around only 1 nW/cm² (FIG. 5, Panel (F)) before 15:45. For the TEG with wavelength-selective surface at the cold side, the heat exchange remains stable both before and after the TEG was shadowed by the building, as shown in FIG. 5, Panel (D). This leads to greatly improved TEG performance with output voltage ~266 40 mV/cm² (FIG. 5, Panel (E)) and output power ~10 nW/cm² (FIG. 5, Panel (F)) before 15:45, when compared with the TEG with bare surface at the cold side. After the TEG devices were shadowed by a building at 15:45, the two TEGs with bare surface and wavelength-selective surface at the cold side have similar total heat exchange and thermoelectric performance, owing to their similar high emissivity in the atmospheric transmission window and the absence of solar irradiation.

Selected Discussion

A high-performance wearable thermoelectric generator with superior stretching, self-healing, recycling, and Lego-like reconfiguration capabilities is reported in this work. To achieve these properties, high-performance modular thermoelectric chips, dynamic covalent thermoset polyimine as substrate and encapsulation, and flowable liquid metal as electrical wiring are integrated through a novel mechanical architecture design of "soft motherboard-rigid plugin modules". This TEG can produce a record-high open-circuit voltage density of 1 V/cm² at temperature difference 95 K among flexible TEGs, which is promising for harvesting low-grade heat to power 'Internet of Things' and wearable electronics. These features enable TEGs to be adaptable to the rapidly changing mechanical and thermal conditions, and user requirements. Furthermore, a wavelength-selective metamaterial film is integrated at the cold side of the TEG to simultaneously maximize the radiative cooling and minimize the absorption of solar irradiation. Therefore the thermoelectric performance can be greatly enhanced under solar irradiation, which is critically important for wearable energy harvesting during outdoor activities. The design concepts, approaches and properties of the TEG system reported in this work can pave the way for delivering the next-generation high-performance, adaptable, customizable, durable, economical and eco-friendly energy harvesting devices with wide applications.

It is also worth noting that the overall design concept of this work is scalable and adaptable to other thermoelectric materials and fabrication methods, including roll-to-roll physical vapor deposition and printing techniques. It is possible to further enhance the thermoelectric performance of the wearable TEG, by improving fabrication process of thermoelectric films, adopting thermoelectric films with better thermoelectric properties, and using traditional thermoelectric legs with much smaller dimensions.

Material Synthesis and Device Fabrication

Thin-film thermoelectric materials were deposited on a polyimide film (125 μm, DuPont) by a thermal evaporator. The target materials of p-type legs and n-type legs for the evaporation were $Bi_{0.5}Sb_{1.5}Te3$ and $Bi_2Te_{2.8}Se_{0.3}$ bulks, respectively, which were prepared by smelting Bi ingot (99.999%, Alfa Aesar), Sb ingot (99.999%, Alfa Aesar), Te ingot (99.999%, Alfa Aesar) and Se ingot (99.999%, Alfa Aesar) in sealed quartz tubes under vacuum below 10-3 Pa using a muffle furnace (KSL-1100X-L) at 1073 K for 5 hours. The deposited thermoelectric films were then heated at 320° C. for 26 min in Argon atmosphere using a tube furnace (OTF-1200X). Au—Ge thin-film electrodes were deposited by a thermal evaporator using Au88Ge12 alloy (99.99%, Kurt. J. Lesker) as the target material. The polyimine substrate is polymerized using three commercial compounds, terephthalaldehyde, 3,3'-Diamino-N-methyldipropylamine and tris(2-aminoethyl)amine. A mixture of 3,3'-Diamino-N-methyldipropylamine (1.251 g, 8.61 310 mmol) and tris(2-aminoethyl)amine (0.252 g, 1.72 mmol) was added to a 25 mL centrifuge tube with a screw cap followed by addition of methanol (20 mL) and terephthalaldehyde (1.5 g, 11.18 mmol). The mixture was stirred till the solution became translucent and yellow in color, then the solution was poured into petri dish coated with PDMS. The solution was cured by evaporative drying in a fume hood for at least 72 hours at room temperature. The recycling solution is a mixture of 3,3'-Diamino-N-316 methyldipropylamine (1.251 g, 8.61 mmol) and tris(2-aminoethyl)amine (0.252 g, 1.72 317 mmol) in methanol. The liquid metal (a mixture of 75.5% gallium and 24.5% indium by weight) was blended with 0.35 wt. % $SiO^2$ particles (radius 40 μm) to improve screen printing yield. The melting point of the liquid metal is 15.3° C. Alternatively, eutectic gallium-indium-tin (Galinstan) (68% Ga, 22% In, and 10% Sn by weight) with a melting point of −19° C. can be adopted for a colder environment. A laser cutting device (EPILOG 322 36EXT-MODEL9000) was used to prepare all the masks and slots in polyimine substrates. The wavelength-selective film was attached on the cold side of the TEG by using a pressure-sensitive tape.

Materials Characterization

Figure 22:
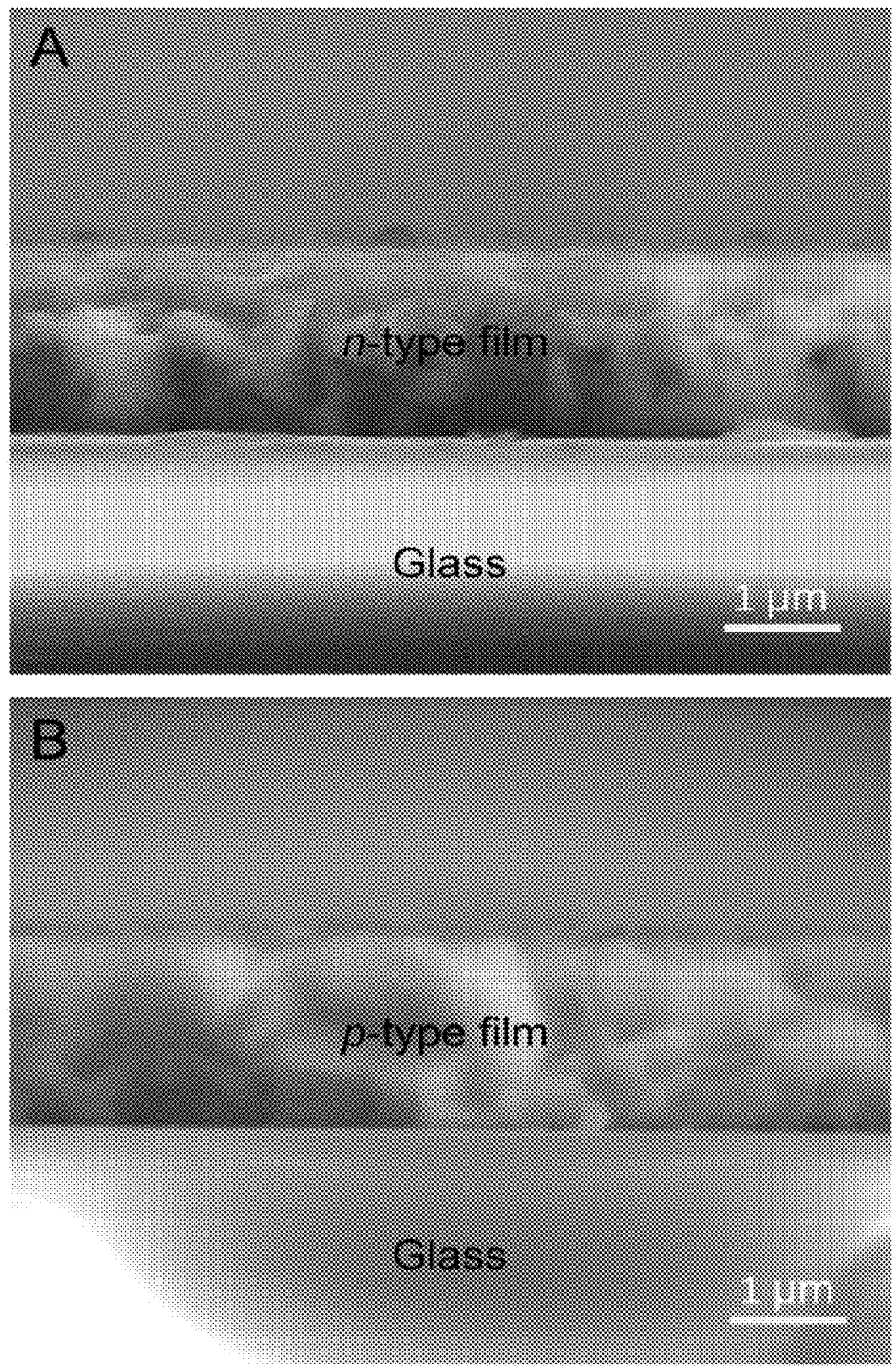
FIG. 22 depicts SEM images of cross sections of (Panel (A)) n-type and (Panel (B)) p-type films. No grain orientations observed in both n-type and p-type films.
Figure 23:
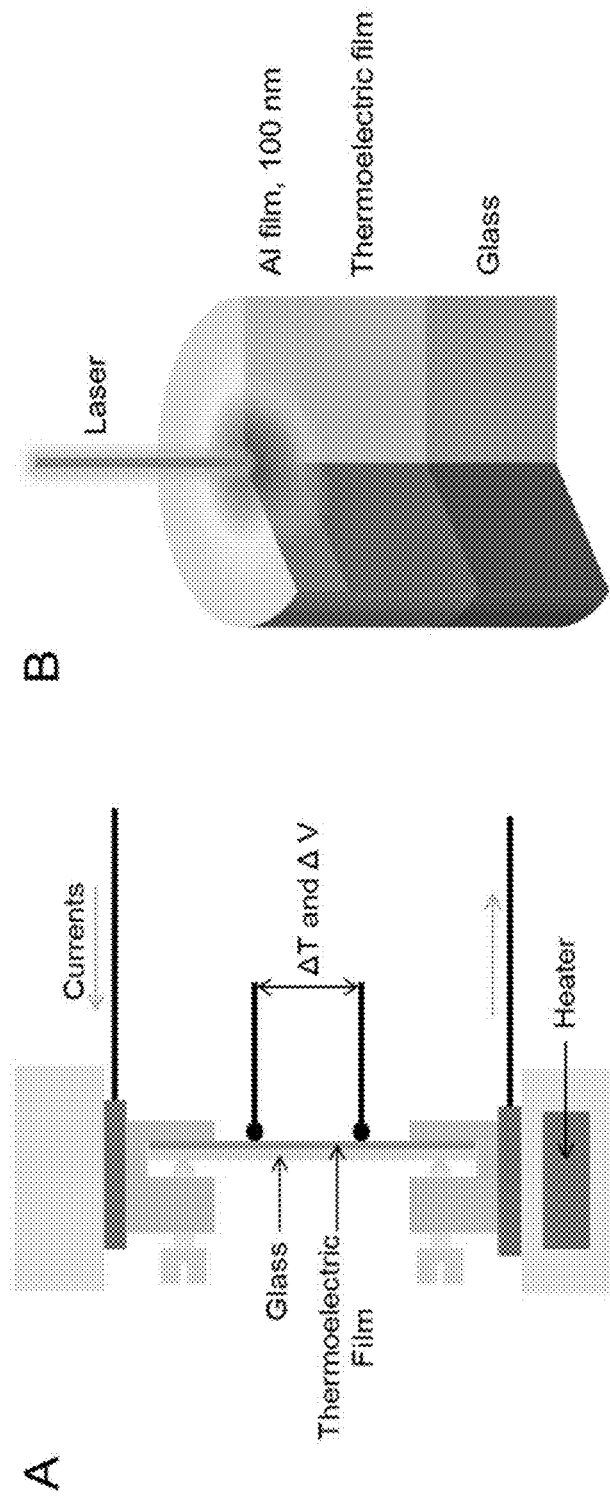
FIG. 23 depicts schematics of physical properties test methods for thermoelectric films. Panel (A) depicts a four probe method for Seebeck coefficient and electrical resistivity. Panel (B) depicts a time-domain thermoreflectance method (TDTR) for thermal conductivity.
Figure 24:
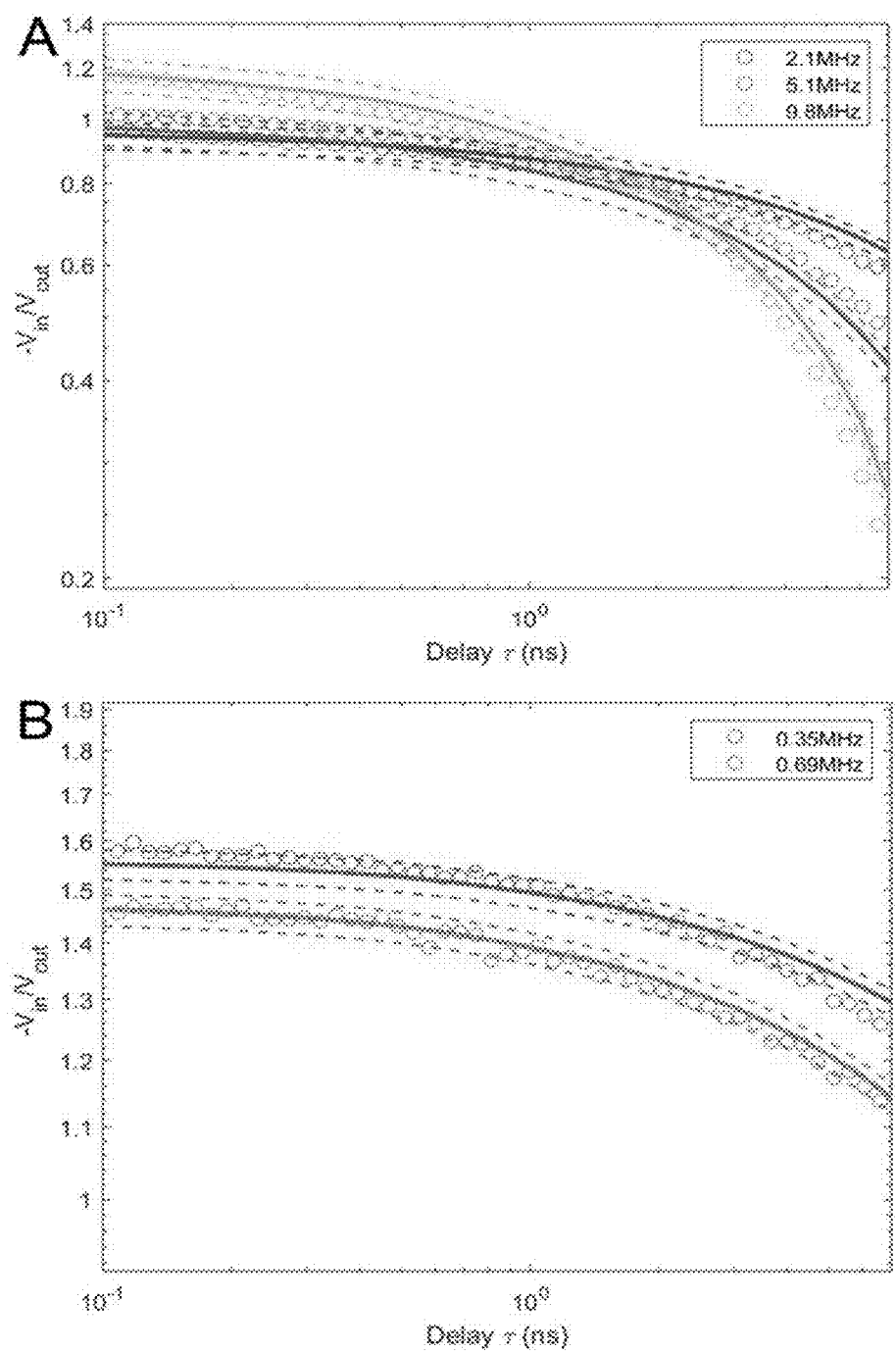
FIG. 24 depicts measured TDTR signal of (Panel (A)) n-type and (Panel (B)) p-type thermoelectric films with a spot radius of 7.5 μm using a 100 nm Al transducer and several modulation frequencies. The solid lines are fitting lines from a thermal model, and the dashed lines are 10% for n-type films, and 798 20% for p-type films bounds on the fitted through-plane thermal conductivity values. The best-fit thermal conductivity is listed in FIG. 25.

The thicknesses of the thermoelectric films and Au—Ge film was measured by a stylus profiler (Bruker DektakXT). The surface microtopography and composition were analyzed using scanning electronic microscope (SEM) (Quanta 200FEG and Hitachi SU3500) accompanied by the energy dispersive X-ray spectroscopy (EDS). The Seebeck coefficient and electrical resistivity were measured by the four probe method on a simultaneous measurement system (UL-VAC ZEM-3), and the thermal conductivity of the thermoelectric films (FIG. 22) was measured by the time-domain thermoreflectance method on a homemade system (FIGS. 23-25). Optical microscope images of the self-healing process were obtained using a super depth of field digital microscope (KEYENCE VHX-1000E).

TEG Output Measurement

The indoor and outdoor performance of TEG were tested by homemade setups (Supplementary FIGS. 11 and 20). The hot side is a temperature-controlled heating table. The cold side is a double-stage cooler (hydrocooling and Peltier cooler) which can accurately control the cold side temperature of TEG from 0° C. to room temperature. Type T thermocouples (wire diameter 0.127 mm, OMEGA TT-T-36) were used to test the cold and hot side temperatures of TEG. The thermocouple wires were fixed by holders beside the tested positions, and only the bare tips of the thermocouples closely touched the tested positions by the elasticity of the thermocouple wires to avoid extra heat loss. No grease, glue, tape, or clamp was used to fix the thermocouples. Room temperature was measured by a type T thermocouple placed in air near the TEG. All the data including the temperature, voltage and resistance were collected by a multifunctional data collector (Keysight 34970A). Infrared images were obtained by an infrared camera (FLIR T630sc). Solar irradiance, outdoor temperature and wind speed were tested by a weather station near the TEG.

Mechanical Characterization

The stretch tests were carried on a homemade stretching equipment. Simulated strain distribution contours in the TEG were obtained using a commercial software Abaqus. The AuGe conductive layer was modeled as skin layer on the surface of the polyimide film and thermoelectric legs, and then meshed by four-node shell elements. The polyimide film, p-type and n-type thermoelectric legs, and polyimine substrate were modeled using eight node solid elements. The elastic moduli of the AuGe, n-type legs, p-type legs, polyimide films and polyimine substrate were 69.2 GPa, 52 GPa, 46 GPa, 2.5 GPa and 2 MPa, respectively. The Poisson's ratio for them were 0.32, 0.25, 0.25, 0.34 and 0.35, respectively. A strain of 120% and bending radius of 3.5 mm were separately applied to 361 the model to simulate experimental conditions.

EQUIVALENTS

Although preferred embodiments of the invention have been described using specific terms, such description is for illustrative purposes only, and it is to be understood that changes and variations may be made without departing from the spirit or scope of the following claims.

INCORPORATION BY REFERENCE

The entire contents of all patents, published patent applications, and other references cited herein are hereby expressly incorporated herein in their entireties by reference.

What is claimed is:

1. An electronic device, comprising;
a polymeric substrate having:
a plurality of slots, each configured for receiving an electronic module;
one or more electrical junctions comprising a stretchable conductive interconnect electronically coupling a slot to another slot of the plurality of slots; and
at least one electronic module comprising:
a film configured to:
support other components of the electronic module; and
be inserted, and be partially housed in, one of the plurality of slots of the polymeric substrate; and
at least one electrode coupled to the film and positioned to be in contact with a corresponding electrical junction of the polymeric substrate when the film is partially housed in the polymeric substrate.

2. The electronic device of claim 1, wherein the at least one electronic module comprises a thermoelectric generator (TEG).

3. The electronic device of claim 1, wherein the at least one electronic module is further configured to be inserted in, and partially housed in, each of the plurality of slots of the polymeric substrate.

4. The electronic device of claim 1, wherein the at least one electronic module comprises a battery, a processor, memory, a communication module, a sensing module, or a combination thereof.

5. The electronic device of claim 1, wherein the at least one electronic module further comprises at least one p-leg and at least one n-leg coupled to the film, wherein the at least one p-leg and the at least one n-leg are electronically coupled together via an electrode.

6. An electronic device system, comprising:
the electronic device of claim 1; and
another electronic device of claim 1,
wherein the electronic device and the other electronic device are coupled to one another via a defined polymeric substrate edge of each electronic device.

7. A method of forming a plurality of electronic devices, comprising:
splitting the polyimine substrate of the electronic device of claim 1 between two of the slots of the polymeric substrate and along the length of the two slots.

8. A method of recycling the electronic device of claim 1, comprising:
immersing the electronic device into a volume of recycling solution comprising 3,3'-Diamino-N-methyldipropylamine and tris(2-aminoethyl)amine in methanol.

9. The method of claim 8, further comprising:
separating the stretchable conductive interconnects and the electrodes from the resulting recycled solution.

10. The method of claim 9, further comprising:
adding a volume of terephthalaldehyde and methanol to the resulting recycled solution.

* * * * *